(12) United States Patent
Nam et al.

(10) Patent No.: US 9,378,820 B2
(45) Date of Patent: Jun. 28, 2016

(54) NONVOLATILE MEMORY DEVICE AND WORLDLINE DRIVING METHOD THEREOF

(71) Applicants: Sang-Wan Nam, Hwasung (KR); Sun-Min Yun, Seoul (KR); Bong-Soon Lim, Seoul (KR); Yoon-Hee Choi, Hwaseong-si (KR)

(72) Inventors: Sang-Wan Nam, Hwasung (KR); Sun-Min Yun, Seoul (KR); Bong-Soon Lim, Seoul (KR); Yoon-Hee Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/741,224

(22) Filed: Jun. 16, 2015

(65) Prior Publication Data

US 2016/0035423 A1 Feb. 4, 2016

(30) Foreign Application Priority Data

Jul. 30, 2014 (KR) ................. 10-2014-0097534

(51) Int. Cl.
*G11C 16/10* (2006.01)
*G11C 16/08* (2006.01)
*G11C 16/04* (2006.01)
*G11C 16/28* (2006.01)

(52) U.S. Cl.
CPC ............ *G11C 16/08* (2013.01); *G11C 16/0483* (2013.01); *G11C 16/10* (2013.01); *G11C 16/28* (2013.01)

(58) Field of Classification Search
CPC .................... G11C 16/10; G11C 16/0483
USPC ............................ 365/185.11, 185.24
See application file for complete search history.

(56) References Cited

U.S. PATENT DOCUMENTS

| | | | |
|---|---|---|---|
| 7,064,981 B2 | 6/2006 | Roohparvar | |
| 7,099,197 B2* | 8/2006 | Satomi | G11C 11/413 365/149 |
| 7,590,002 B2 | 9/2009 | Mokhlesi et al. | |
| 7,679,133 B2 | 3/2010 | Son et al. | |
| 7,995,389 B2 | 8/2011 | Iwai | |
| 8,520,441 B2 | 8/2013 | Yuh | |
| 8,553,466 B2 | 10/2013 | Han et al. | |
| 8,559,235 B2 | 10/2013 | Yoon et al. | |
| 8,570,808 B2 | 10/2013 | Park et al. | |
| 8,593,878 B2 | 11/2013 | Chen et al. | |
| 8,654,587 B2 | 2/2014 | Yoon et al. | |
| 8,848,426 B2* | 9/2014 | Azuma | G11C 13/004 365/148 |
| 2004/0156230 A1* | 8/2004 | Satomi | G11C 11/413 365/154 |

(Continued)

FOREIGN PATENT DOCUMENTS

KR 102005010813 11/2005

*Primary Examiner* — Michael Tran
(74) *Attorney, Agent, or Firm* — Harness, Dickey & Pierce, P.L.C.

(57) ABSTRACT

According to example embodiments of inventive concepts, a nonvolatile memory device includes a memory cell array, an address decoder, an input/output circuit, a voltage generation circuit, and control logic. The memory cell array includes a plurality of memory blocks on a substrate. Each of the memory blocks includes a plurality of strings connected between bit lines and a common source line. The address decoder is configured to measure impedance information of word lines of a selected memory block. The voltage generation circuit is configured to generate word line voltages to be applied to word lines, and at least one of the word line voltages includes an offset voltage and a target voltage. The control logic is configured to adjust a level of the offset voltage and the offset time depending on the measured impedance information of the word lines.

20 Claims, 24 Drawing Sheets

(56) References Cited

U.S. PATENT DOCUMENTS

| | | |
|---|---|---|
| 2006/0028870 A1 | 2/2006 | Roohparvar |
| 2008/0158967 A1 | 7/2008 | Mokhlesi et al. |
| 2010/0128526 A1 | 5/2010 | Iwai |
| 2011/0233648 A1 | 9/2011 | Seol et al. |
| 2012/0033501 A1 | 2/2012 | Park et al. |
| 2012/0120729 A1 | 5/2012 | Yuh |
| 2012/0300527 A1 | 11/2012 | Shim et al. |
| 2013/0128672 A1 | 5/2013 | Chen et al. |
| 2013/0279251 A1 | 10/2013 | Lee |
| 2014/0063974 A1 | 3/2014 | Yang |
| 2015/0138889 A1* | 5/2015 | Joo ................ G11C 16/0483 365/185.11 |
| 2015/0243673 A1* | 8/2015 | Oh ................ H01L 27/11582 365/185.11 |
| 2015/0279471 A1* | 10/2015 | Lee ................ G11C 16/14 365/185.11 |
| 2015/0287468 A1* | 10/2015 | Yi ................ G11C 16/16 365/185.11 |

* cited by examiner

NONVOLATILE MEMORY DEVICE AND WORDLINE DRIVING METHOD THEREOF

CROSS-REFERENCE TO RELATED APPLICATIONS

The present application claims priority under 35 U.S.C. §119 to Korean Patent Application No. 10-2014-0097534, filed on Jul. 30, 2014 in the Korean Intellectual Property Office, the entire contents of which are hereby incorporated by reference.

BACKGROUND

The present disclosure relates to a nonvolatile memory device and/or a word line driving method thereof.

A semiconductor memory device is a memory device that is fabricated using semiconductors, such as silicon (Si), germanium (Ge), gallium arsenide (GaAs), and indium phosphide (InP). Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and so on. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on. The flash memory device may be divided into a NOR type flash memory device and a NAND type flash memory device.

For the past several years, a semiconductor memory device of a three-dimensional structure has been researched to improve the degree of integration of the semiconductor memory device. The three-dimensional semiconductor memory device has structural characteristics that are different from a conventional two-dimensional semiconductor memory device. A variety of driving methods for driving three-dimensional semiconductor memory may be different than driving methods for two-dimensional semiconductor memory.

SUMMARY

According to example embodiments of inventive concepts, a nonvolatile memory device includes: a memory cell array, an address decoder, an input/output circuit, a voltage generation circuit, and control logic. The memory cell array includes a plurality of memory blocks on a substrate. Each of the memory blocks includes a plurality of strings arranged in a direction perpendicular to the substrate and connected between bit lines and a common source line. The address decoder is configured to select one of the memory blocks in response to an address and to measure impedance information of word lines of the selected memory block. The input/output circuit is configured to at least one of store data to be programmed at memory cells connected to a selected word line during a program operation and to store data read from memory cells connected to the selected word line during a read or verification operation. The voltage generation circuit is configured to generate word line voltages to be applied to the selected word line and unselected word lines. At least one of the word line voltages includes an offset voltage and a target voltage. The offset voltage is different (e.g., higher or lower) than the target voltage during an offset time. The control logic is configured to adjust a level of the offset voltage and the offset time depending on the measured impedance information of the word lines.

In example embodiments, the control logic may be configured to calculate impedance values of word lines of each memory block depending on the measured impedance information of the word lines. The control logic may be configured to control the voltage generation circuit to adjust the level of the offset voltage and the offset time depending on the calculated impedance values of the word lines.

In example embodiments, the address decoder may include an impedance measurement part configured to measure impedance information of the word lines depending on a test voltage and a reference voltage from the voltage generation circuit.

In example embodiments, the impedance measurement part may include a first input terminal configured to receive the test voltage, a second input terminal configured to receive the reference voltage; an ammeter configured to measure a current flowing through the first input terminal; and a comparator configured to output a comparison result based on the reference voltage and a voltage of a node between at least one of the word lines and the first input terminal.

In example embodiments, the selected memory block may be a dummy block that is not configured to store data.

In example embodiments, one end of at least one of the word lines may be electrically connected to the impedance measurement part and the other end of the at least one word line may be connected to the common source line.

In example embodiments, the word lines may include a first word line and a second word line that are adjacent to each other in the direction perpendicular to the substrate. The first and second word lines may be interconnected.

In example embodiments, one end of the first word line may be electrically connected to the impedance measurement part, one end of the second word line may be configured to receive a ground voltage from the voltage generation circuit, and the other ends of the first and second word lines may be interconnected.

In example embodiments, one end of the first word line is electrically connected to the impedance measurement part, one end of the second word line receives a ground voltage from the voltage generation circuit, and the other end of the first word line is connected with the one end of the second word line.

In example embodiments, the address decoder may include a first address decoder and a second address decoder, and word lines connected to the first address decoder may be different from word lines connected to the second address decoder. The word lines may include a first word line connected to the first address decoder and a second word line connected to the second address decoder. A height of the second word line may be the same as a height of the first word line. The first and second word lines may be interconnected.

In example embodiments, one end of the first word line may be electrically connected to the impedance measurement part, one end of the second word line may be configured to receive a ground voltage from the voltage generation circuit, and the other ends of the first and second word lines may be interconnected.

In example embodiments, one end of the first word line may be electrically connected to the impedance measurement part, one end of the second word line receives a ground voltage from the voltage generation circuit, and the other end of the first word line may be connected with the one end of the second word line.

In example embodiments, the selected memory block may be a normal block configured to store data. The normal block may include a string selection line and a ground selection line with the word lines interposed therebetween. The address decoder may include an SSL impedance measurement part and a GSL impedance measurement part. The SSL impedance measurement part may be configured to receive a test voltage and a reference voltage from the voltage generation circuit. The SSL impedance measurement part may be configured to measure impedance information of the string selection line. The GSL impedance measurement part may be configured to receive the test voltage and the reference voltage from the voltage generation circuit. The GSL impedance measurement part may be configured to measure impedance information of the ground selection line. One end of the string selection line may be electrically connected to the SSL impedance measurement part and the other end thereof may be configured to receive a ground signal. One end of the ground selection line may be electrically connected to the GSL impedance measurement part and the other end may be configured to receive the ground signal.

According to example embodiments of inventive concepts, a word line driving method of a nonvolatile memory device that includes a plurality of memory blocks on a substrate, each of the memory blocks including a plurality of strings arranged in a direction perpendicular to the substrate and connected between bit lines and a common source line, is provided. The word line driving method includes: calculating impedance values of word lines; setting a level of an offset voltage and an offset time based on the calculated impedance values of the word lines; applying the offset voltage, having the set level, to the word lines during the set offset time; and applying a target voltage to the word lines after the offset time, the target voltage being different than the offset voltage.

In example embodiments, an offset voltage higher or lower than a target level is applied to a word line, thereby shortening a word line setup time. Overall performance of a nonvolatile memory device may be improved.

In example embodiments, the offset voltage level and an offset time may be adjusted based on measured word line impedances. Overall performance of a nonvolatile memory device may be improved.

According to example embodiments of inventive concepts, a nonvolatile memory device includes: a memory cell array, an impedance measurement part, an input/output circuit, a voltage generation circuit, and a control logic. The memory cell array includes a plurality of memory blocks on a substrate. Each of the memory blocks includes a plurality of strings on the substrate and connected between bit lines and a common source line. The impedance measurement part is connected to the plurality of memory blocks through the plurality of word lines. The impedance measurement part is configured to measure impedance information of the plurality of word lines. The input/output circuit is connected to the plurality of memory blocks through the bit lines. The voltage generation circuit is connected to the impedance measurement part. The voltage generation circuit is configured to generate voltages for applying to the plurality of word lines. The control logic is configured to adjust a level and an application time of one of the voltages applied to at least one of the word lines connected to a selected one of one of the plurality of memory blocks based on the measured impedance information of the at least one of the word lines.

In example embodiments, the control logic may be configured to adjust a level of an offset voltage and a duration of an offset time that the offset voltage is applied to the at least one of the word lines based on the measured impedance information of the at least one of the word lines, the control logic may be configured to apply the offset voltage to the at least one of the word lines before applying a target voltage to the at least one of the word lines, and the level of offset voltage may be different than a level of the target voltage.

In example embodiments, the selected one of the plurality of memory blocks may be a normal block that is configured to store data.

In example embodiments, the selected one of the plurality of memory blocks may be a dummy block that is not configured to store data.

In example embodiments, the impedance measurement part may include a first input terminal configured to receive a test voltage, a second input terminal configured to measure a current flowing through the first input terminal, and a comparator configured to output a comparison result based on the reference voltage and a voltage of a node between the first input terminal and the at least one of the word lines connected to the selected one of the plurality of memory blocks.

In example embodiments, the plurality of strings may be arranged in a direction perpendicular to the substrate, and each of the plurality of strings may include a ground selection transistor, a plurality of memory cells stacked on top of each other, and a string selection transistor on the plurality of memory cells.

BRIEF DESCRIPTION OF THE FIGURES

The above and other features of inventive concepts will become apparent from the following description on non-limiting embodiments of inventive concepts, as illustrated in the following figures in which like reference numerals refer to like parts throughout the various figures unless otherwise specified. The drawings are not necessarily to scale, emphasis instead being placed upon illustrating principles of inventive concepts. In the drawings.

DETAILED DESCRIPTION

Figure 1:
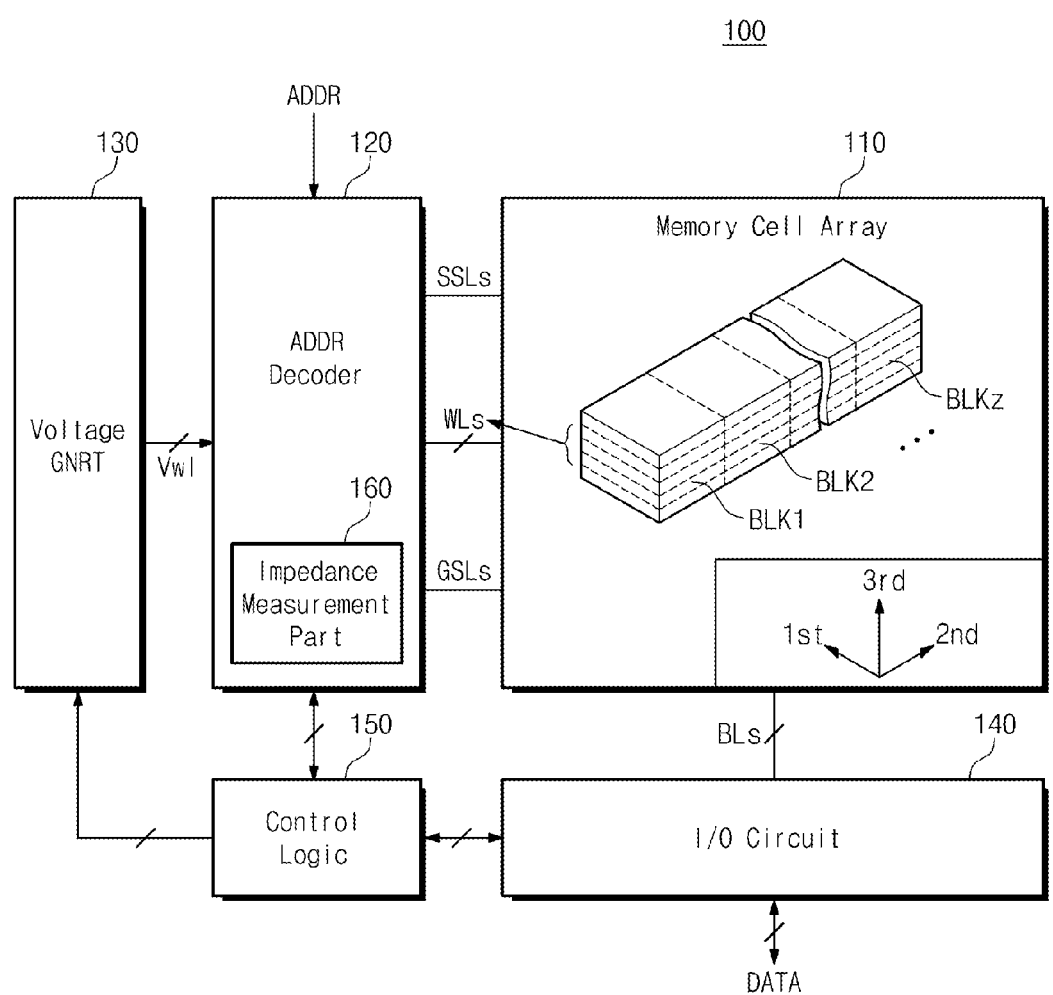
FIG. 1 is a block diagram schematically illustrating a non-volatile memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted. It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a nonvolatile memory device according to example embodiments of inventive concepts. Referring to FIG. 1, a nonvolatile memory device 100 contains a memory cell array 110, an address decoder 120, a voltage generation circuit 130, an input/output circuit 140, and a control logic 150.

The nonvolatile memory device 100 may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, the nonvolatile memory device 100 may be implemented to have a three-dimensional array structure. Example embodiments of inventive concepts may be embodied as a Charge Trap Flash (CTF) memory device, in which a charge storage layer is made up of an insulation film, as well as a flash memory device, in which a charge storage layer is made up of a conductive floating gate. Below, an example where the nonvolatile memory device 100 is a vertical NAND flash memory device (VNAND) is described. However, example embodiments are not limited thereto.

The memory cell array 110 includes a plurality of memory blocks BLK1 through BLKz (z being an integer of 2 or more), each of which is connected to the address decoder 120 via word lines, at least one string selection line SSL, and at least one ground selection line GSL and to the input/output circuit 140 via bit lines. In example embodiments, the word lines may be formed to have a shape where plates are stacked on top of each other.

The memory blocks BLK1 through BLKz may include a plurality of strings that are three-dimensionally arranged on a substrate along a first direction and a second direction different from the first direction and along a third direction (e.g., a direction perpendicular to a plane formed in the first and second directions). Herein, each string may contain at least one string selection transistor, a plurality of memory cells, and at least one ground selection transistor connected in series in a direction perpendicular to the substrate. Each memory cell may store one or more bits. In example embodiments, at least one dummy cell may be provided between at least one string selection transistor and a plurality of memory cells. As another example, at least one dummy cell may be provided between a plurality of memory cells and at least one ground selection transistor.

The address decoder 120 selects one of the memory blocks BLK1 to BLKz in response to an address. The address decoder 120 is connected to the memory cell array 110 through the word lines, the at least on string selection line SSL, and the at least one ground selection line GSL. The address decoder 120 selects the word lines, the at least one string selection line SSL, and the at least one ground selection line GSL depending on a decoded row address. The address decoder 120 decodes a column address of an input address. The decoded column address may be transferred to the input/output circuit 140. In example embodiments, the address decoder 120 may include a row decoder, a column decoder, and an address buffer.

The address decoder 120 contains an impedance measurement part 160. The impedance measurement part 160 measures impedance information of each of the word lines of a selected memory block BLKi. The address decoder 120 provides the measured impedance information to the control logic 150.

The voltage generation circuit 130 generates operating voltages including the following: a program voltage, a pass voltage, a read voltage, a read pass voltage, a verification voltage, an erase operation, a common source line voltage, and a well voltage. The voltage generation circuit 130 also generates a word line voltage Vwl used for a program/read/erase operation. Herein, the word line voltage Vwl contains a variable offset pulse for shortening a word line setup time. In example embodiments, a voltage level of the variable offset voltage (or, pulse) may be higher or lower than a normal voltage level (hereinafter, referred to as target level) of the word line voltage needed to drive word lines.

The voltage generation circuit 130 selectively generates the word line voltage Vwl having the offset voltage in response to a control of the control logic 150. That is, the voltage generation circuit 130 may generate the word line voltage Vwl including the offset voltage or not including the offset voltage.

Moreover, the voltage generation circuit 130 changes a level and a generation time of the offset voltage in response to a control of the control logic 150.

The input/output circuit 140 is connected to the memory cell array 110 through the bit lines. The input/output circuit 140 is configured to receive the decoded column address from the address decoder 120. The input/output circuit 140 selects the bit lines depending on the decoded column address.

The input/output circuit 140 may contain a plurality of page buffers that store program data at a program operation and reads data at a read operation. Each of the page buffers may include a plurality of latches. During a program operation, data stored in the page buffers may be programmed at a page of a selected memory block. During a read operation, data read from a page of a selected memory block may be stored in the page buffers via the bit lines. The control logic controls an overall operation of the nonvolatile memory device 100 including the following: a program operation, a read operation, and an erase operation. The control logic 150 operates in response to control signals or commands from an external device. The control logic 150 controls the address decoder 120, the voltage generation circuit 130, and the input/output circuit 140 at program, erase, and read operations.

More particularly, the control logic 150 calculates impedance values of word lines of each memory block BLKi, depending on impedance information of the selected memory block BLKi. The control logic 150 controls the voltage generation circuit 130 such that an offset voltage level and an offset time are changed depending on the calculated impedance values of the word lines.

In a general nonvolatile memory device, word lines may have different impedance values. In this case, even though word line voltages applied to word lines have the same target level, there are differences between setup times when the word line voltages reach the target level and between overshoots that the word line voltages become higher than the target level in the setup times. The setup time difference and the overshoot difference are performance factors. For example, the worst word line setup time may be a factor by which an overall operating time is decided.

In contrast, the nonvolatile memory device 100 according to example embodiments of inventive concepts calculates impedance values of word lines and adjusts an offset voltage level and an offset time depending on the calculated impedance values of the word lines. For example, a word line voltage to be applied to a word line having a relatively great impedance value has an offset voltage of which the level is relatively great and which has a relatively long offset time; moreover, a word line voltage to be applied to a word line having a relatively small impedance value has an offset voltage of which the level is relatively small and which has a relatively short offset time. The nonvolatile memory device 100 according to example embodiments of inventive concepts constantly maintains a setup time of a word line voltage regardless of an impedance difference between word lines and sets an overshoot of the word line voltage to an optimal condition, thereby improving performance of the nonvolatile memory device 100 overall.

Figure 2A:
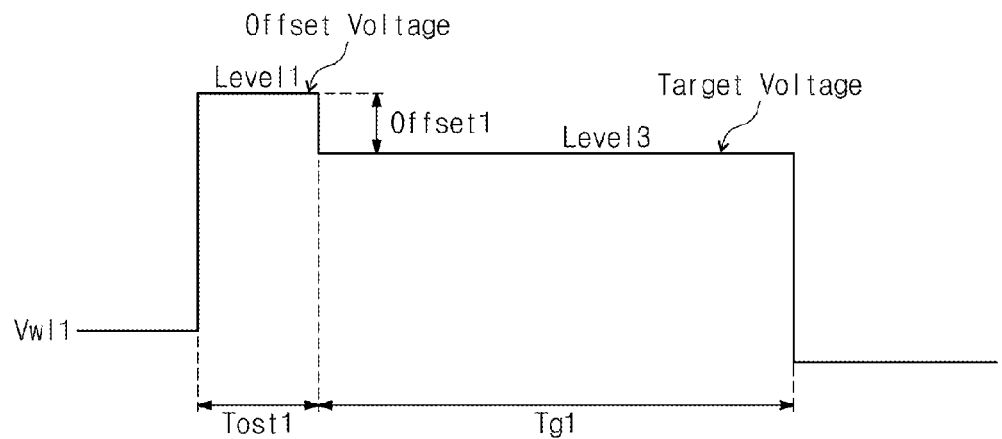
FIG. 2A is a diagram showing a word line voltage to be applied to a word line having a first impedance value, according to example embodiments of inventive concepts.
Figure 2B:
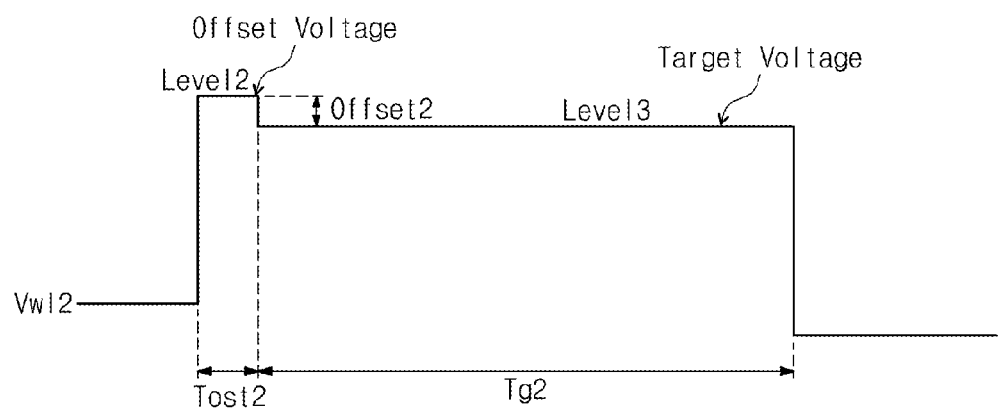
FIG. 2B is a diagram showing a word line voltage to be applied to a word line having a second impedance value, according to example embodiments of inventive concepts.

FIG. 2A is a diagram showing a word line voltage to be applied to a word line having a first impedance value, according to example embodiments of inventive concepts. FIG. 2B is a diagram showing a word line voltage to be applied to a word line having a second impedance value, according to example embodiments of inventive concepts. In FIGS. 2A and 2B, a first impedance value may be greater than a second impedance value. In FIGS. 2A and 2B, a word line voltage has first through third levels.

Referring to FIG. 2A, a first word line voltage Vwl1 is applied to a word line having a first impedance value. The first word line voltage Vwl1 includes (or consists of) a first offset voltage and a target voltage. The first offset voltage may be supplied during a first offset time Tost1, and the target voltage may be supplied during a first target time Tg1 after the first offset time Tost1 elapses. The first offset voltage has a first level, and the target voltage has a third level. The first level is higher than the third level as much as a first offset offset1.

Referring to FIG. 2B, a second word line voltage Vwl2 is applied to a word line having a second impedance value. The second word line voltage Vwl2 includes (or consists of) a second offset voltage and the target voltage. The second offset voltage may be supplied during a second offset time Tost2, and the target voltage may be supplied during a second target time Tg2 after the second offset time Tost2 elapses. The second offset voltage has a second level, and the target voltage has the third level. The second level is higher than the third level as much as a second offset offset2.

Referring to FIGS. 2A and 2B, the target voltages of the first and second word line voltages Vwl1 and Vwl2 have the same level. The first offset time Tost1 is longer than the second offset voltage Tost2 because the first impedance value is greater than the second impedance value. Moreover, the first target time Tg1 is shorter than the second target time Tg2. The first level is higher than the second level. That is, the first offset offset1 is greater than the second offset offset2.

As illustrated in FIGS. 2A and 2B, an offset voltage level and an offset time may be adjusted depending on an impedance value of a word line.

Meanwhile, in FIGS. 2A and 2B, the word line voltages Vwl1 and Vwl2 have offset voltages higher than the target level during the offset times Tost1 and Tost2. However, example embodiments of inventive concepts are not limited thereto. For example, the offset voltage may be lower than the target level.

Figure 3A:
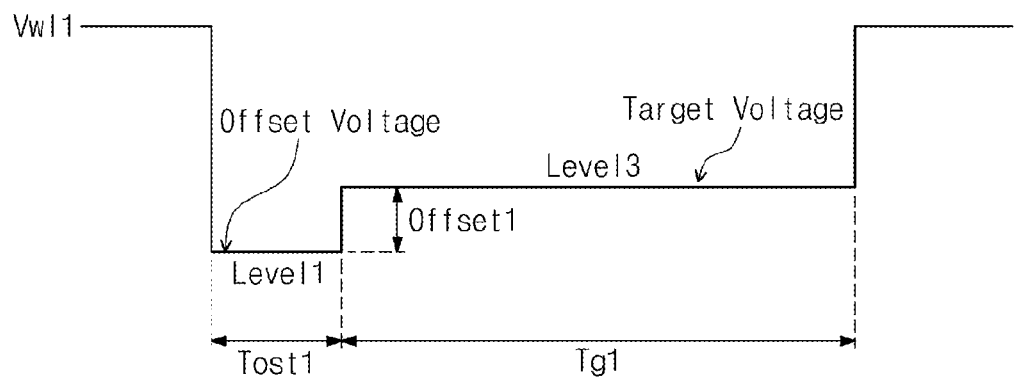
FIG. 3A is a diagram showing a word line voltage to be applied to a word line having a first impedance value, according to example embodiments of inventive concepts.
Figure 3B:
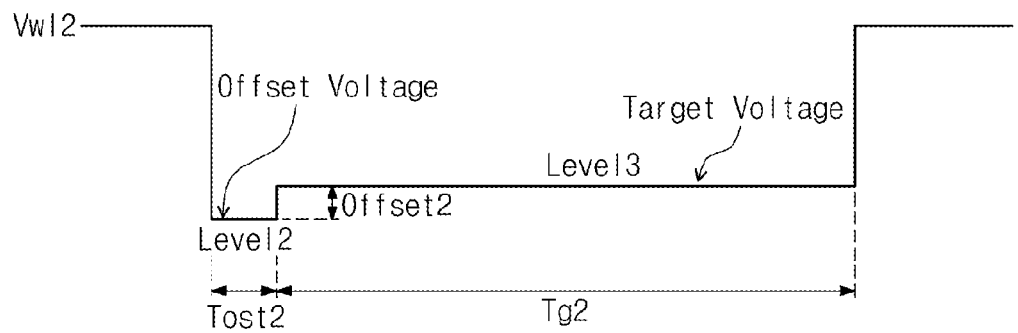
FIG. 3B is a diagram showing a word line voltage to be applied to a word line having a second impedance value, according to example embodiments of inventive concepts.

FIG. 3A is a diagram showing a word line voltage to be applied to a word line having a first impedance value, according to example embodiments of inventive concepts. FIG. 3B is a diagram showing a word line voltage to be applied to a word line having a second impedance value, according to example embodiments of inventive concepts. In FIGS. 3A and 3B, a first impedance value may be greater than a second impedance value. In FIGS. 3A and 3B, a word line voltage has first through third levels.

Referring to FIG. 3A, a first word line voltage Vwl1 is applied to a word line having a first impedance value. The first word line voltage Vwl1 includes (or consists of) a first offset voltage and a target voltage. The first offset voltage may be supplied during a first offset time Tost1, and the target voltage may be supplied during a first target time Tg1 after the first offset time Tost1 elapses. The first offset voltage has a first level, and the target voltage has a third level. The first level is lower than the third level as much as a first offset offset1.

Referring to FIG. 3B, a second word line voltage Vwl2 is applied to a word line having a second impedance value. The second word line voltage Vwl2 includes (or consists of) a second offset voltage and the target voltage. The second offset voltage may be supplied during a second offset time Tost2, and the target voltage may be supplied during a second target time Tg2 after the second offset time Tost2 elapses. The second offset voltage has a second level, and the target voltage has the third level. The second level is lower than the third level as much as a second offset offset2.

Referring to FIGS. 3A and 3B, the target voltages of the first and second word line voltages Vwl1 and Vwl2 have the same level. The first offset time Tost1 is longer than the second offset voltage Tost2 because the first impedance value is greater than the second impedance value. Moreover, the first target time Tg1 is shorter than the second target time Tg2. The first level is lower than the second level. That is, the first offset offset1 is greater than the second offset offset2. As illustrated in FIGS. 3A and 3B, an offset voltage level and an offset time may be adjusted depending on an impedance value of a word line.

Figure 4:
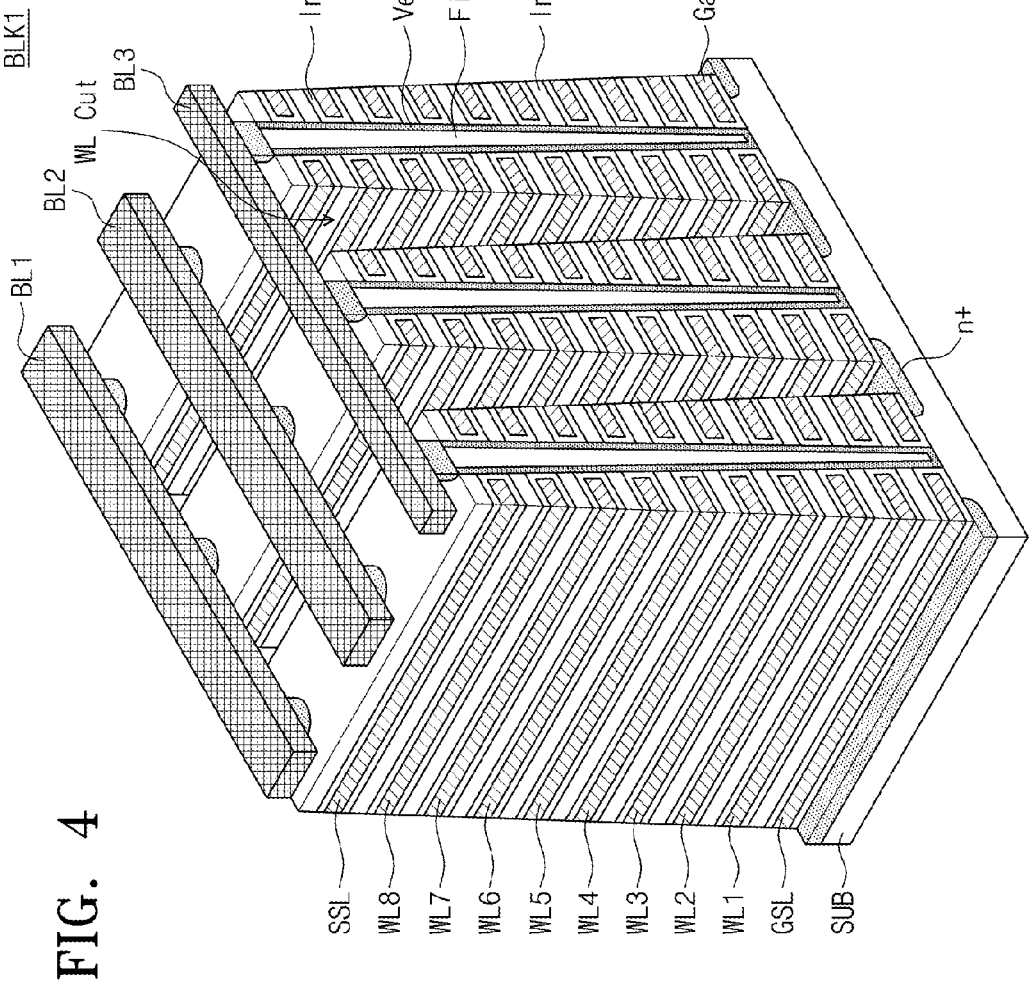
FIG. 4 is a perspective view schematically illustrating a 3D structure of a memory block illustrated in FIG. 1.

FIG. 4 is a perspective view schematically illustrating a 3D structure of a memory block BLK1 illustrated in FIG. 1. Referring to FIG. 4, a memory block BLK1 is formed in a direction perpendicular to a substrate SUB. The substrate SUB may include a well having a first conductive type. For example, the substrate SUB may include a well formed by injecting III-group elements (e.g., boron). For example, the substrate SUB may include a pocket P well that is formed in an N well. Below, it is assumed that the substrate SUB includes a P well (or, a pocket P well). However, example embodiments of inventive concepts are not limited thereto. Alternatively, a gate electrode layer and an insulation layer may be deposited above the substrate SUB.

An information storage layer is formed between the gate electrode layers and the insulation layers. The information storage layer includes (or consists of) a tunnel insulation layer, a charge storage layer, and a blocking insulation layer.

V-shaped pillars are formed when the gate electrode layer and the insulation layer are patterned in a vertical direction. The pillars are in contact with the substrate SUB via the gate electrode layers and the insulation layers. In each pillar, an outer portion may be a vertical active pattern and be formed of channel semiconductor (e.g., silicon), and an inner portion may be a filling dielectric pattern and may be formed of an insulation material (e.g., silicon oxide).

A string may be formed such that a pillar connected to a bit line penetrates at least one ground selection line GSL, a plurality of word lines, and at least one string selection line SSL disposed between word line cuts.

The gate electrode layers of the memory block BLK1 may be connected with a ground selection line GSL, a plurality of word lines WL1 to WL8, and a string selection line SSL. The gate electrode layers may be stacked on top of each other above impurity regions (e.g., n+) in the substrate SUB. The pillars of the memory block BLK1 are connected with a plurality of bit lines BL1 to BL3. The pillar of the memory block BLK1 may be on top of portions of the substrate SUB that are between the impurity regions n+. In FIG. 4, one memory block BLK1 is illustrated as having two selection lines SSL and GSL, eight word lines WL1 to WL8, and three bit lines BL1 to BL3. However, example embodiments of inventive concepts are not limited thereto. For example, one memory block BLK1 alternatively may have a plurality of string selection lines SSL on top of the word lines WL1 to WL8 and/or may have a plurality of ground selection lines GSL below the word lines WL1 to WL8. Additionally, although eight word lines WL1 to WL8 are illustrated, the number of word lines WL1 to WL8 may be different just as the number of bit lines BL1 to BL3 may be different depending on design considerations.

For ease of description, an example where one memory block BLK1 includes two selection lines SSL and GSL, eight word lines WL1 to WL8, and three bit lines BL1 to BL3 is described with reference to FIG. 4. Impedance values of the word lines WL1 through WL8 may vary with a pillar shape and a word line cut shape. For example, the impedance values of the word lines WL1 through WL8 may increase in proportion to an increase in heights of the word lines WL1 through WL8. The reason is that widths of the word lines WL1 through WL8 become narrower as heights of the word lines WL1 through WL8 increase.

Figure 5:
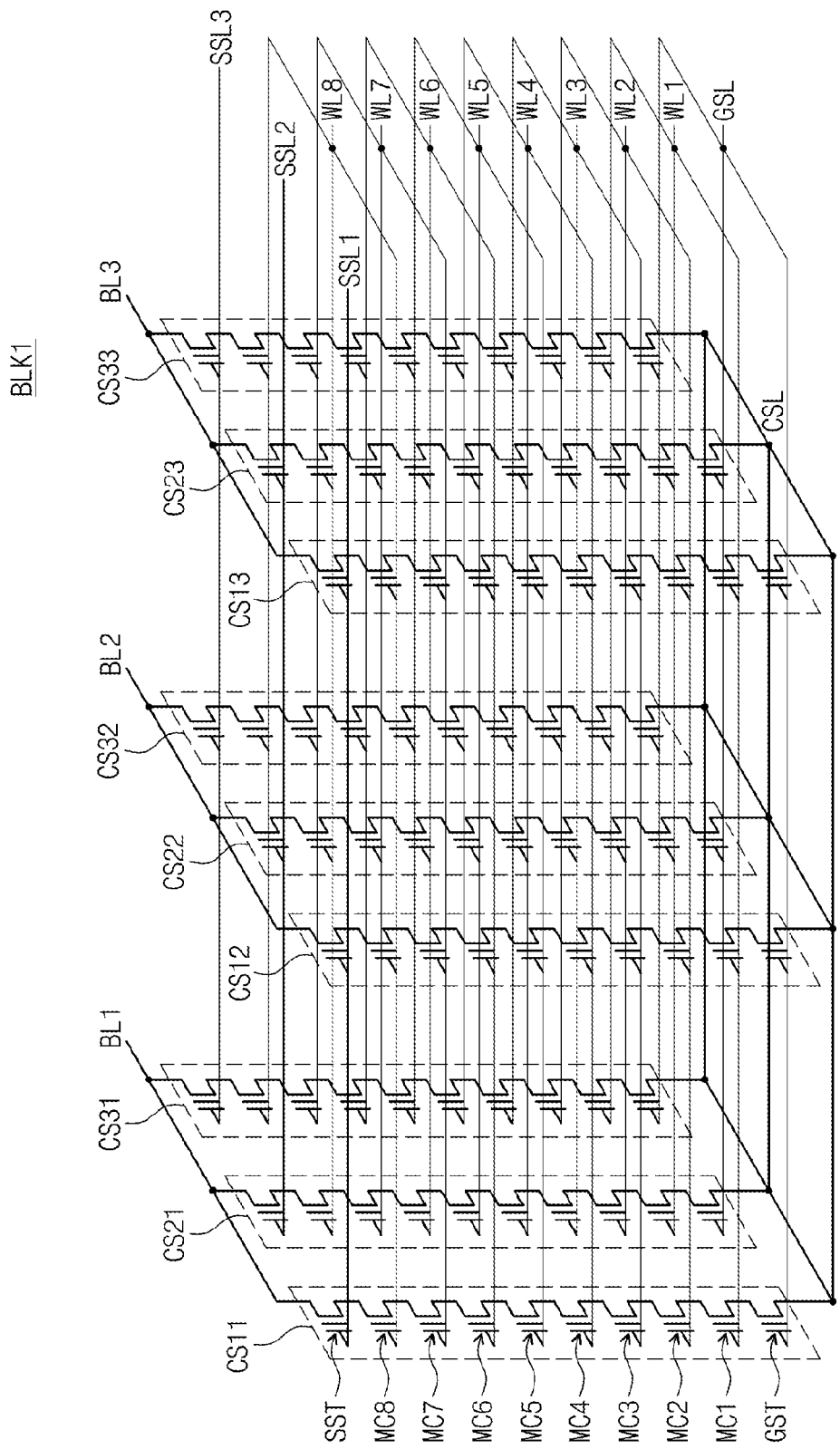
FIG. 5 is a circuit diagram schematically illustrating an equivalent circuit of a memory block shown in FIG. 4, according to example embodiments of inventive concepts.

FIG. 5 is a circuit diagram schematically illustrating an equivalent circuit of a memory block BLK1 shown in FIG. 4, according to example embodiments of inventive concepts. Referring to FIG. 5, cell strings CS11 through CS33 are connected between bit lines BL1 through BL3 and a common source line CSL. Each cell string (e.g., CS11) includes a string selection transistor SST, a plurality of memory cells MC1 through MC8, and a ground selection transistor GST. In FIG. 5, an example is shown where a string includes eight memory cells. However, example embodiments of inventive concepts are not limited thereto.

The string selection transistors SST are connected to a string selection line SSL. The string selection line SSL is divided into first to third string selection lines SSL1 to SSL3. In FIG. 5, an example is illustrated that includes three string selection line SSL1 to SSL3 correspond to a bit line. However, example embodiments of inventive concepts are not limited thereto. The memory block BLK may include at least two string selection lines corresponding to a bit line. Similarly, at least two ground selection lines may be connected to each string.

The ground selection transistor GST is connected to a ground selection line GSL. Ground selection lines GSL of cell strings are interconnected. The string selection transistors SST are connected to bit lines BL1 to BL3, and the ground selection transistors GST are connected to the common source line CSL.

In each string, the memory cells MC1 through MC8 are connected to corresponding word lines WL1 through WL8. A set of memory cells that are connected to a word line and programmed at the same time may be referred to as a page. The memory block BLK is formed of a plurality of pages. Also, a word line is connected with a plurality of pages. Referring to FIG. 5, word lines (e.g., WL4) are connected in common to three pages.

Meanwhile, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In case of a 2-bit MLC, two pages of data are stored at a physical page. This means that six pages of data are stored at memory cells connected to the fourth word line WL4.

A nonvolatile memory device 100 may be implemented with a charge trap flash (CTF) memory device. In this case, there may be generated the initial verify shift (IVS) phenomenon that charge trapped in programmed CTF is redistributed and leaked by lapse of time. Reprogramming may be performed to overcome such distribution deterioration.

Figure 6:
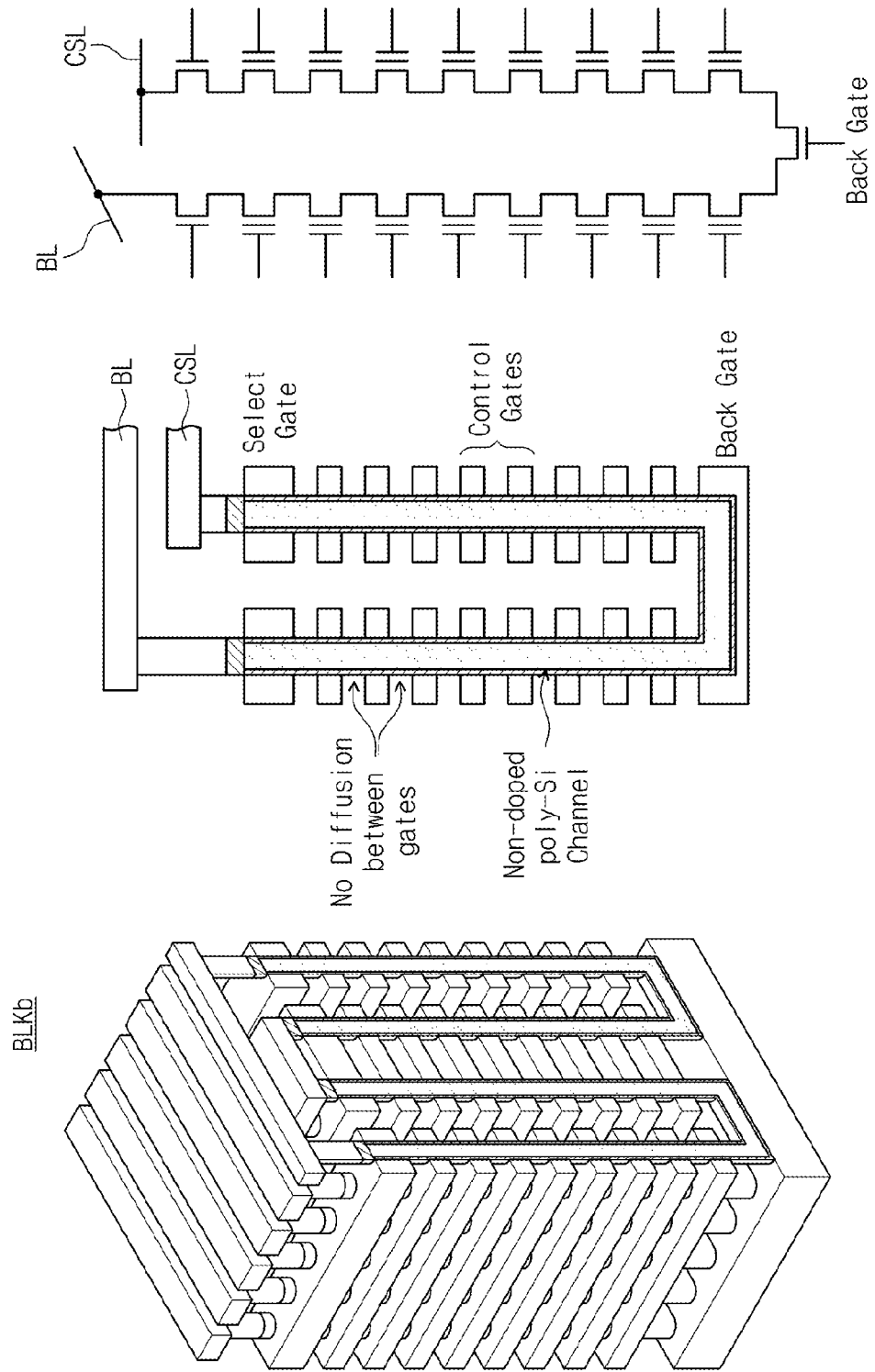
FIG. 6 is a diagram schematically illustrating a memory block according to example embodiments of inventive concepts.

In FIG. 6, an example is shown where the memory block BLK1 shares the ground selection line. However, example embodiments of inventive concepts are not limited thereto. For example, in example embodiments, like the string selection line, the ground selection line GSL may be divided into a plurality of ground selection lines.

FIG. 6 is a diagram schematically illustrating a memory block according to example embodiments of inventive concepts. Referring to FIG. 6, a string is formed between a bit line BL and a common source line CSL and includes first memory cells formed between the bit line BL and a substrate in a vertical direction and second memory cells formed between the substrate and a common source line CSL in the vertical direction.

In example embodiments, a memory block BLKb may have a Pipe-shaped Bit Cost Scalable (P-BiCS) structure.

Figure 7:
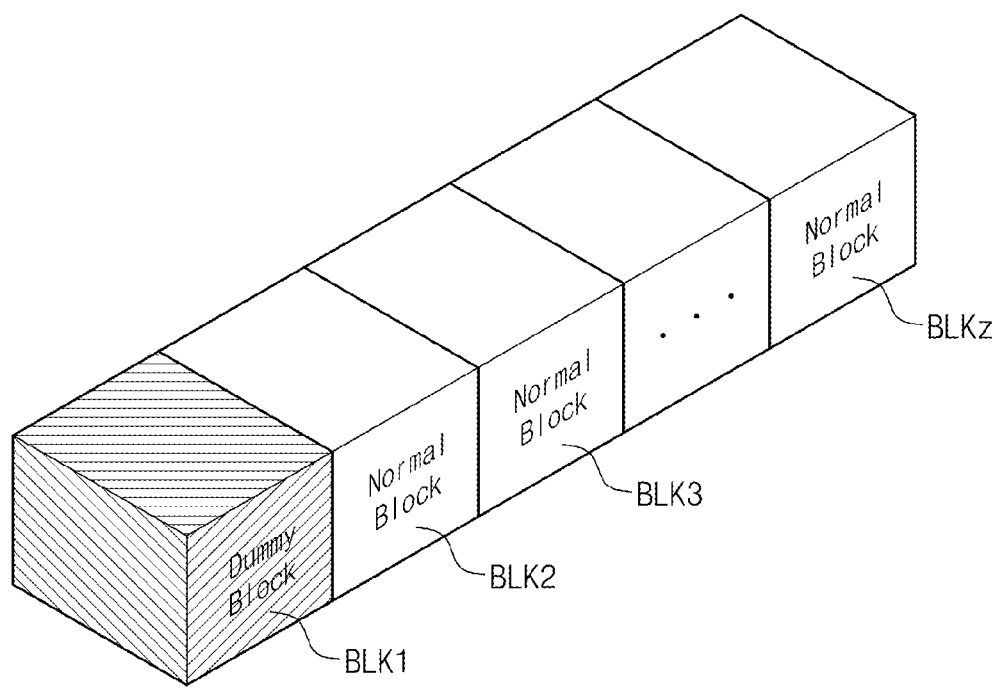
FIG. 7 is a diagram showing a plurality of memory blocks according to example embodiments of inventive concepts.

FIG. 7 is a diagram showing a plurality of memory blocks according to example embodiments of inventive concepts.

Referring to FIG. 7, at least one of memory blocks BLK1 through BLKz may be a dummy block. The memory blocks BLK1 through BLKz according to example embodiments of inventive concepts may include one dummy block BLK1.

The dummy block BLK1 is a memory block for measuring impedance values of word lines. In example embodiments, the dummy block may be a memory blocks that is not used to store data.

Impedance information of the word lines measured by means of the dummy block BLK1 may be used as word line impedance information of the normal memory blocks BLK2 through BLKz. The dummy block BLK1 has a structure that is different from the normal memory blocks BLK2 through BLKz to measure impedance information of word lines.

Figure 8:
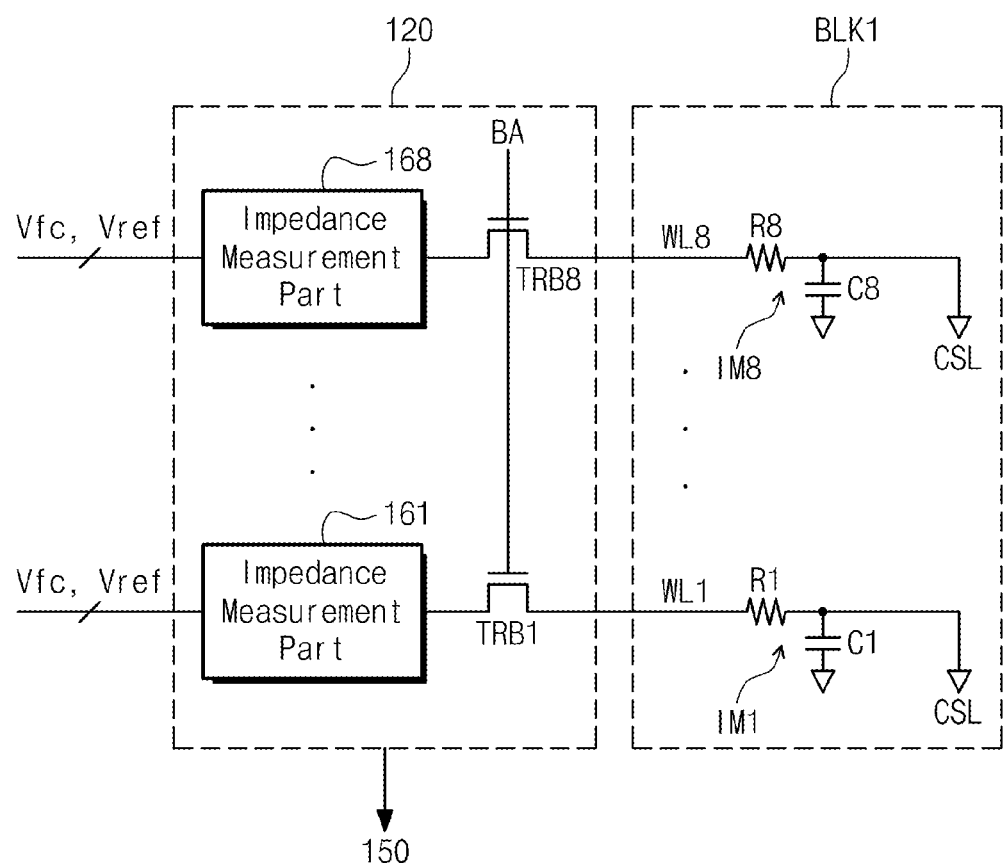
FIG. 8 is diagram showing a dummy block shown in FIG. 7 and an address decoder.

FIG. 8 is diagram showing a dummy block shown in FIG. 7 and an address decoder. In FIG. 8, word lines of a dummy block are illustrated with an equivalent circuit as seen from an address decoder 120.

Referring to FIG. 8, the address decoder 120 is connected to word lines WL1 through WL8. The address decoder 120 contains impedance measurement parts 161 through 168 and block selection transistors TRB1 through TRB8.

The dummy block BLK1 contains word lines WL1 through WL8, which have intrinsic impedance values IM1 through IM8.

Impedances IM1 through IM8 of the word lines WL1 through WL8 include (and/or consist of) corresponding word line resistors R1 through R8 and corresponding word line capacitors C1 through C8. The word line resistors R1 through R8 are resistors of the word lines WL1 through WL8, and the word line capacitors C1 through C8 are parasitic capacitors formed between the word lines WL1 through WL8 and neighboring lines. In the address decoder 120, one impedance measurement part and one block selection transistor may be connected to a corresponding word line. Below, a word line WL1, an impedance measurement part 161, and a block selection transistor TRB1 that are interconnected will be described as an example.

The impedance measurement part 161 receives a test voltage Vfc and a reference voltage Vref from a voltage generation circuit 130 (refer to FIG. 1) and measures impedance information. The impedance measurement part 161 provides the measured impedance information to control logic 150 (refer to FIG. 1).

The block selection transistor TRB1 is connected between the impedance measurement part 161 and the word line WL1. The block selection transistor TRB1 is turned on or off by a block selection signal BA. Selected is the dummy block BLK1 when the block selection transistor TRB1 is turned on.

One end of the word line WL1 is electrically connected to the impedance measurement part 161 through the block selection transistor TRB1, and the other end thereof is connected to a common source line CSL to receive a ground voltage.

Although FIG. 8 illustrates an example with eight word lines WL1 through WL8 and eight corresponding measurements parts 161 through 168 and block selection transistors TRB1 through TRB8, example embodiments are not limited thereto. In example embodiments, the number of word lines in the dummy block may be adjusted and the number of impedance measurement parts and block selection transistors may also be adjusted to correspond to the number of word lines in the dummy block.

Below, a method for measuring a word line will be described.

Figure 9:
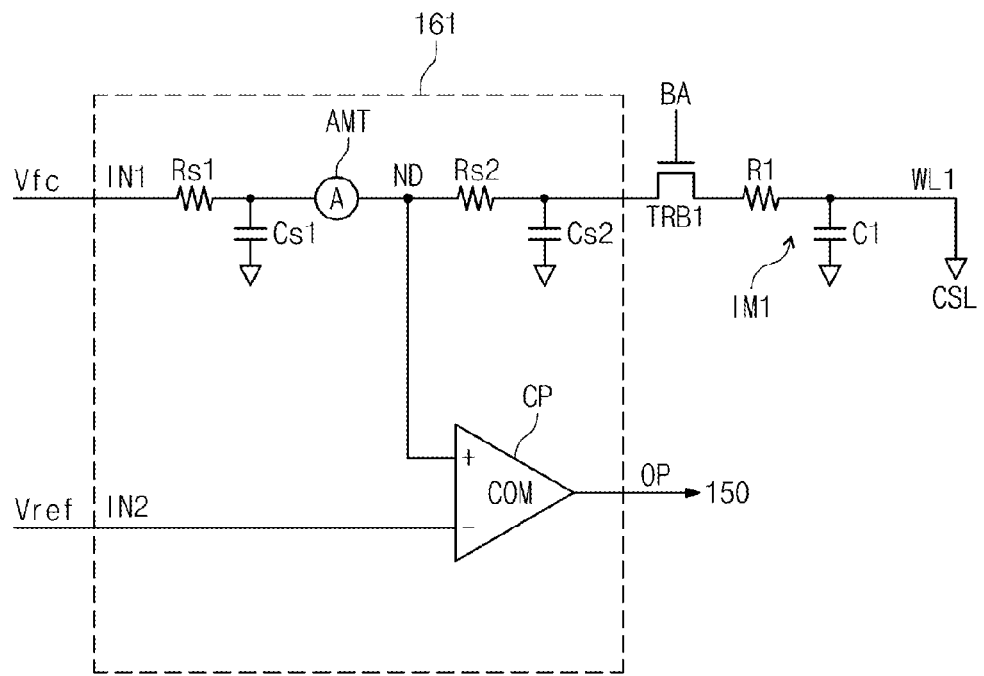
FIG. 9 is a diagram showing an impedance measurement part, a block selection transistor, and a word line shown in FIG. 8.

FIG. 9 is a diagram showing an impedance measurement part, a block selection transistor, and a word line shown in FIG. 8.

Referring to FIG. 9, an impedance measurement part 161 contains a first input terminal IN1, a second input terminal IN2, an output terminal OP, an ammeter AMT, and a comparator CP.

A test voltage Vfc is applied to the first input terminal IN1, and a reference voltage Vref is applied to a second input terminal IN2.

The ammeter AMT measures current flowing at the first input terminal IN1. In example embodiments, the ammeter AMT is connected between the first input terminal IN1 and a block selection transistor TRB1. However, example embodiments of inventive concepts are not limited thereto. Even though not included in the impedance measurement part 161, the ammeter AMT may be connected between first input terminal IN1 and the common source line CSL. When a pulsed test voltage Vfc is received, the ammeter AMT measures current flowing between the first input terminal IN1 and the common source line CSL.

The comparator CP compares a voltage of a node ND between the word line WL1 and the first input terminal IN1 with the reference voltage Vref.

A first input terminal (+) of the comparator CP is connected to a node ND between the first input terminal IN1 and the block selection transistor TRB1. A second input terminal (−) of the comparator CP is connected to the second input terminal IN2 to receive the reference voltage Vref.

In example embodiments, the first and second input terminals of the comparator CP may be changeable.

An output terminal of the comparator CP is connected to the output terminal OP of the impedance measurement part 161. The comparator CP compares voltages applied to the first and second input terminals (+) and (−) and outputs a low or high signal to the control logic 150 as the comparison result.

Impedance between the node ND and the first input terminal IN1 is denoted by a first input resistor Rs1 and a first input capacitor Cs1, and impedance between the node ND and the block selection transistor TRB1 is denoted by a second input resistor Rs2 and a second input capacitor Cs2.

Values of the first and second input resistors Rs1 and Rs2 may be based on design values determined through empirical study. If current measured by the ammeter AMT is determined, a resistance value of the word line WL1 may be decided. The control logic 150 calculates a resistance value R1 of the word line WL1 by means of current measured by the ammeter AMT.

Figure 10:
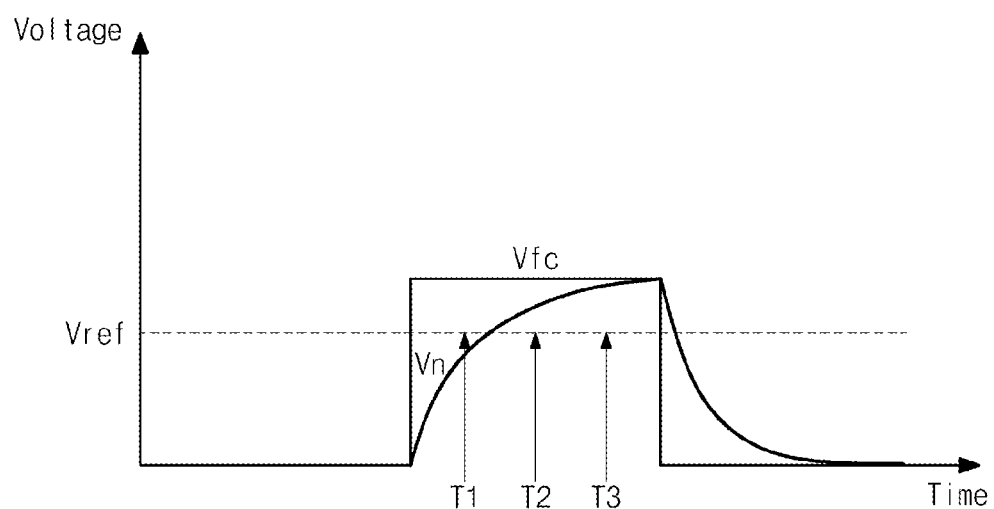
FIG. 10 is a diagram showing a test voltage and a reference voltage according to example embodiments of inventive concepts.

FIG. 10 is a diagram showing a test voltage and a reference voltage according to example embodiments of inventive concepts.

Referring to FIGS. 9 and 10, if a test voltage Vfc is applied in the form of a pulse, a voltage Vn of a node ND may be delayed due to a time constant of a circuit that is formed between a first input terminal IN1 and a common source line CSL.

A reference voltage Vref may be applied once or more times at specific points in time. In FIG. 10, an example is shown where the reference voltage Vref is applied at first through third points in time T1 through T3 while the test voltage Vfc is applied.

A comparator CP compares the reference voltage Vref and the voltage Vn of the node ND at each point in time and outputs a high or low signal as the comparison result. For example, at the first point in time, the comparator CP outputs a low signal because the voltage Vn of the node ND is lower than the reference voltage Vref. At the second and third points in time, the comparator CP outputs a high signal because the voltage Vn of the node ND is higher than the reference voltage Vref.

In example embodiments, control logic 150 may include a mapping table that stores the first through third points in time T1 through T3 and capacitance values corresponding to low and high signals. However, example embodiments of inventive concepts are not limited thereto. For example, the mapping table may be implemented outside a nonvolatile memory device 100 (e.g., a memory controller 14 shown in FIG. 21).

The control logic 150 calculates a capacitance value between a first input terminal IN1 and a common source line CSL, depending on a low or high signal from the comparator CP at each of the first through third points in time T1 through T3. Now that capacitance values of first and second input capacitors Cs1 and Cs2 are determined, the control logic 150 calculates a capacitance value C1 of a word line WL1.

According to example embodiments of inventive concepts, the control logic 150 separately calculates an impedance value of each of word lines WL1 through WL8 of a dummy block BLK1 and uses impedance information of word lines measured by means of the dummy block BLK1 as word line impedance information of memory blocks BLK2 through BLKz. The control logic 150 may adjust an offset voltage level and an offset time, based on impedance values of word lines.

Figure 11:
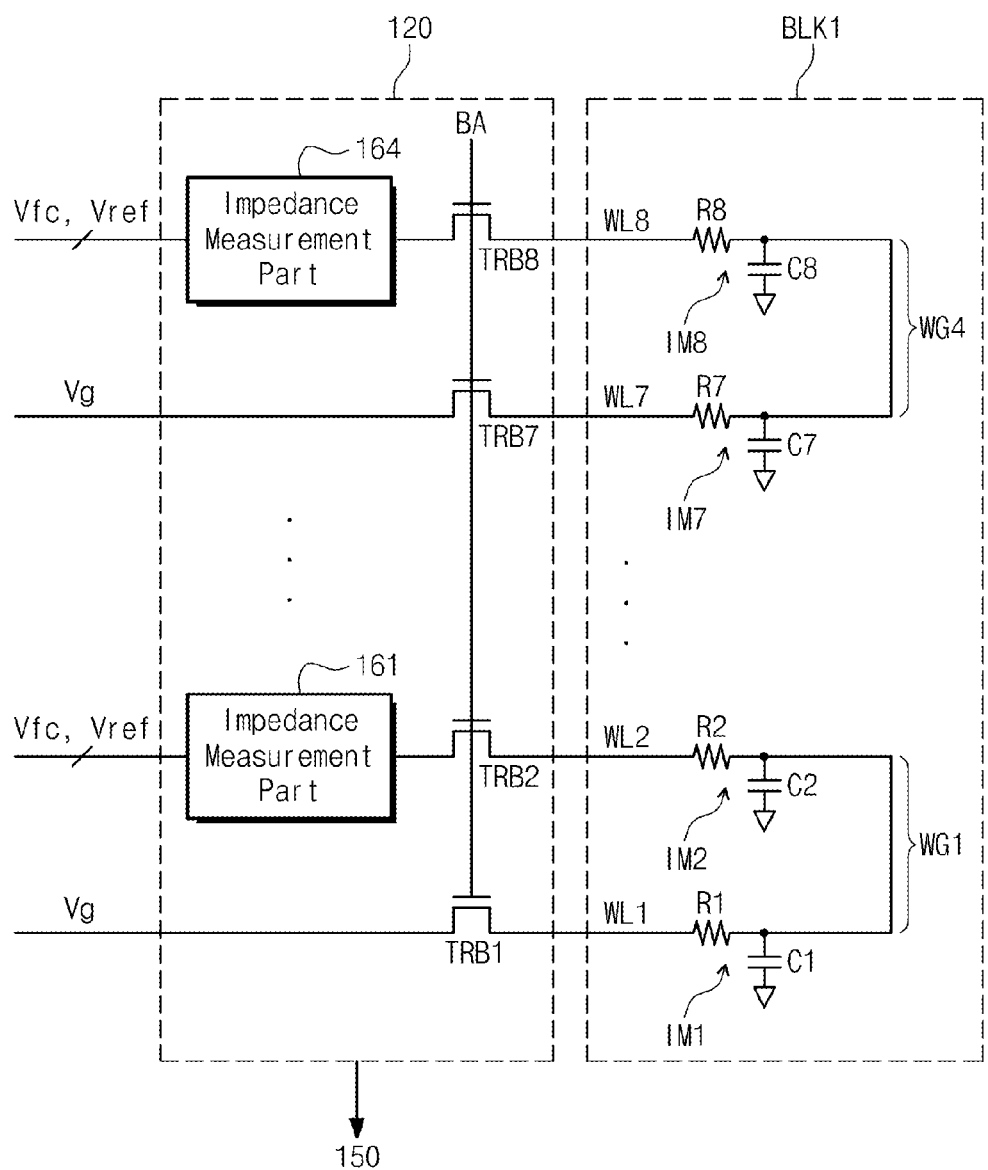
FIG. 11 is a diagram showing an address decoder and a dummy block shown in FIG. 7, according to example embodiments of inventive concepts.

FIG. 11 is a diagram showing an address decoder and a dummy block shown in FIG. 7, according to example embodiments of inventive concepts. FIG. 11 shows an equivalent circuit of word lines of a dummy block as seen from an address decoder. A difference between FIGS. 8 and 11 will be mainly described.

Word lines WL1 through WL8 are divided into word line groups WG1 through WG4 each including two word lines adjacent to each other. For example, a word line group WG1 contains two word lines WL1 and WL2. The word line group WG1, an impedance measurement part 161, and block selection transistors TRB1 and TRB2 constitute one current path.

Below, a word line group WG1 and block selection transistors TRB1 and TRB2 and an impedance measurement part 161 connected to the word line group WG1 will be described.

The impedance measurement part 161 is connected to one WL2 of word lines WL1 and WL2 of the word line group WG1. This means that the number of impedance measurement parts 161 through 164 is half the number of word lines WL1 through WL8.

The impedance measurement part 161 receives a test voltage Vfc and a reference voltage Vref from a voltage generation circuit 130 (refer to FIG. 1) to measure impedance information of the word lines WL1 and WL2 of the word line group WG1. The impedance measurement part 161 provides the measured impedance information to control logic 150 (refer to FIG. 1).

The block selection transistors TRB1 and TRB2 are turned on or off by a block selection signal BA. One TRB2 of the block selection transistors TRB1 and TRB2 connected to the word lines WL1 and WL2 of the word line group WG1 is connected to the impedance measurement part 161; however, the other TRB1 is not connected to the impedance measurement part 161. The block selection transistor TRB1 not connected to the impedance measurement part 161 receives a ground voltage Vg from the voltage generation circuit 130.

The word lines WL1 and WL2 of the word line group WG1 are interconnected. One end of the word line WL2 is electrically connected to the impedance measurement part 161 through the block selection transistor TRB2, and one end of the word line WL1 receives the ground voltage Vg through the block selection transistor TRB1. The other ends of the word lines WL1 and WL2 are connected to each other.

The impedance measurement part 161 is configured substantially the same as that of FIG. 9, and a description thereof is thus omitted.

The impedance measurement part 161 measures impedance values of the word lines WL1 and WL2 of the word line group WG1. The control logic 150 uses an average of the measured impedance values of the word lines WL1 and WL2 as an impedance value of each of the word lines WL1 and WL2.

The control logic 150 uses impedance information of word lines measured by means of a dummy block BLK1 as impedance information of word lines of normal memory blocks BLK2 through BLKz (refer to FIG. 7). The control logic 150 adjusts an offset voltage level and an offset time, depending on impedance of word lines.

Although FIG. 11 illustrates an example with eight word lines WL1 through WL8 and four corresponding measurements parts 161 through 164 and block selection transistors TRB1 through TRB8, example embodiments are not limited thereto. In example embodiments, the number of word lines in the dummy block may be adjusted and the number of impedance measurement parts and block selection transistors may also be adjusted based on the number of word lines in the dummy block.

Figure 12:
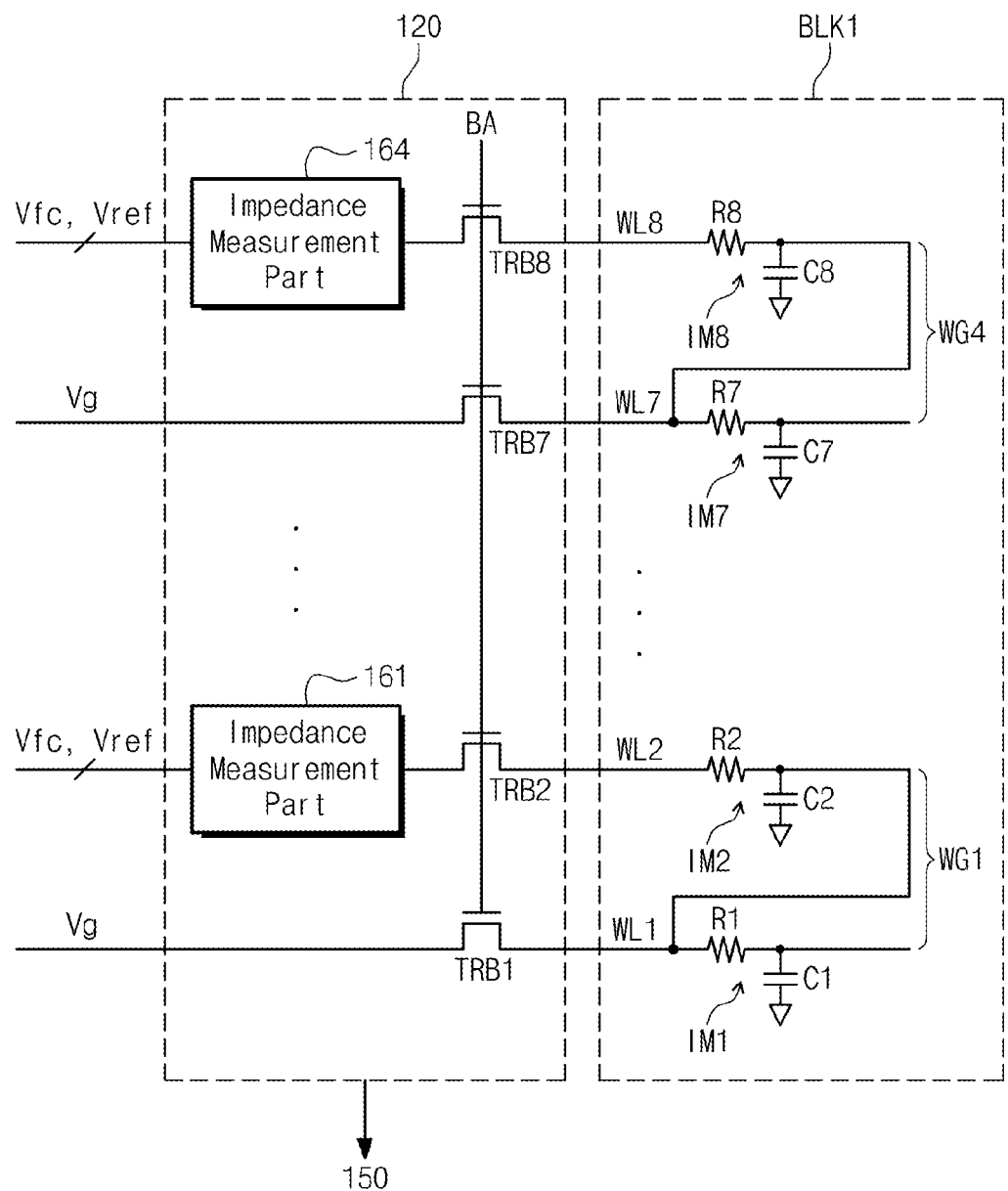
FIG. 12 is a diagram showing an address decoder and a dummy block shown in FIG. 7, according to example embodiments of inventive concepts.

FIG. 12 is a diagram showing an address decoder and a dummy block shown in FIG. 7, according to example embodiments of inventive concepts. FIG. 12 shows an equivalent circuit of word lines of a dummy block as seen from an address decoder 120. A difference between FIGS. 11 and 12 will be mainly described.

Below, a word line group WG1 and block selection transistors TRB1 and TRB2 and an impedance measurement part 161 connected to the word line group WG1 will be described with reference to FIG. 12.

Word lines WL1 and WL2 of the word line group WG1 are interconnected. One end of the word line WL2 is electrically connected to the impedance measurement part 161 through the block selection transistor TRB2, and one end of the word line WL1 receives the ground voltage Vg through the block selection transistor TRB1. The other ends of the word lines WL1 and WL2 are connected to each other.

The impedance measurement part 161 receives a test voltage Vfc and a reference voltage Vref from a voltage generation circuit 130 (refer to FIG. 1) to measure an impedance value of one WL2 of the word lines WL1 and WL2 of the word line group WG1. The impedance measurement part 161 provides the measured impedance information to control logic 150 (refer to FIG. 1).

According to example embodiments of inventive concepts, the impedance measurement part 161 measures an impedance value of one WL2 of the word lines WL1 and WL2 of the word line group WG1. The control logic 150 uses the measured impedance value of the word line WL2 as an impedance value of the other of the word lines WL1 and WL2.

The control logic 150 uses impedance information of word lines measured by means of a dummy block BLK1 as impedance information of word lines of normal memory blocks BLK2 through BLKz (refer to FIG. 7). The control logic 150 adjusts an offset voltage level and an offset time, depending on impedance of word lines.

Although FIG. 12 illustrates an example with eight word lines WL1 through WL8 and four corresponding measurements parts 161 through 164 and block selection transistors TRB1 through TRB8, example embodiments are not limited thereto. In example embodiments, the number of word lines in the dummy block may be adjusted and the number of impedance measurement parts and block selection transistors may also be adjusted based on the number of word lines in the dummy block.

Figure 13:
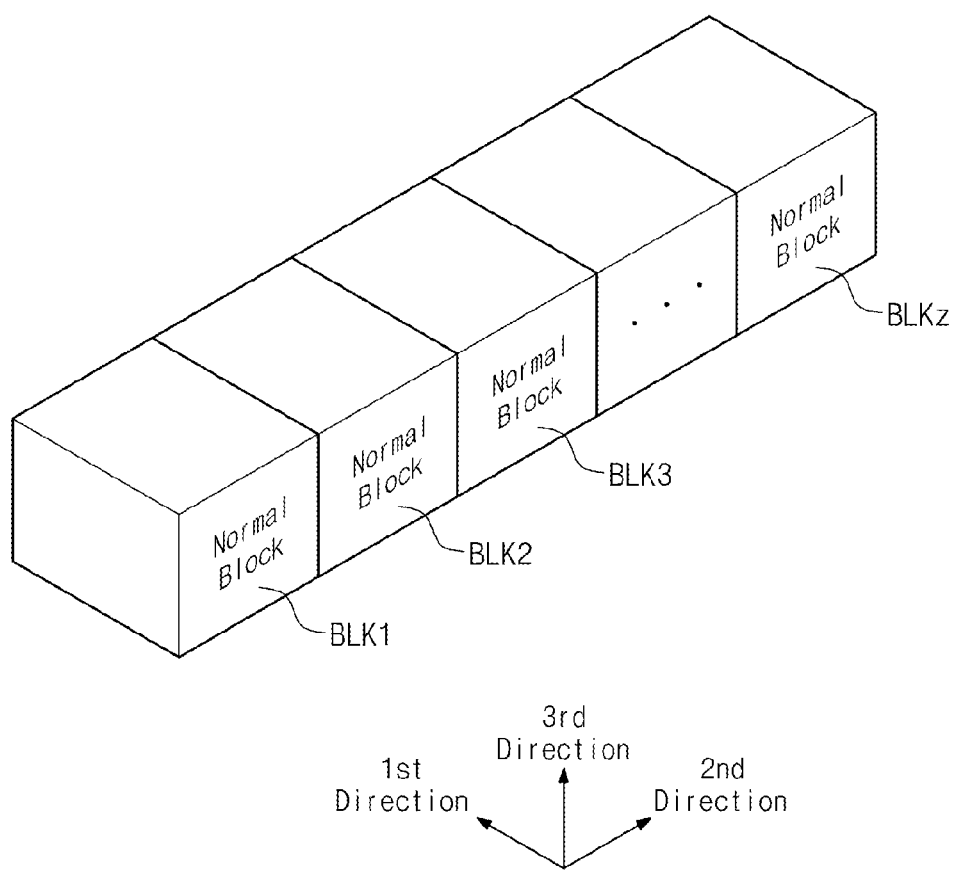
FIG. 13 is a diagram showing a plurality of memory blocks according to example embodiments of inventive concepts.

FIG. 13 is a diagram showing a plurality of memory blocks according to example embodiments of inventive concepts.

Referring to FIG. 13, memory blocks BLK1 through BLKz are normal blocks. That is, unlike FIG. 7, in the plurality of memory blocks according to example embodiments in FIG. 13 do not include a dummy block for measuring impedance values of word lines. However, example embodiments of inventive concepts are not limited thereto. For example, at least one of the memory blocks BLK1 through BLKz may include a dummy block to be used for any other purpose, not impedance measurement.

According to example embodiments of inventive concepts, each of the blocks may be used to measure impedance values of word lines and store data. Impedance information of word lines measured by means of each normal block is utilized to an offset voltage level and an offset time about a word line voltage. The normal blocks may have the same structure.

Figure 14:
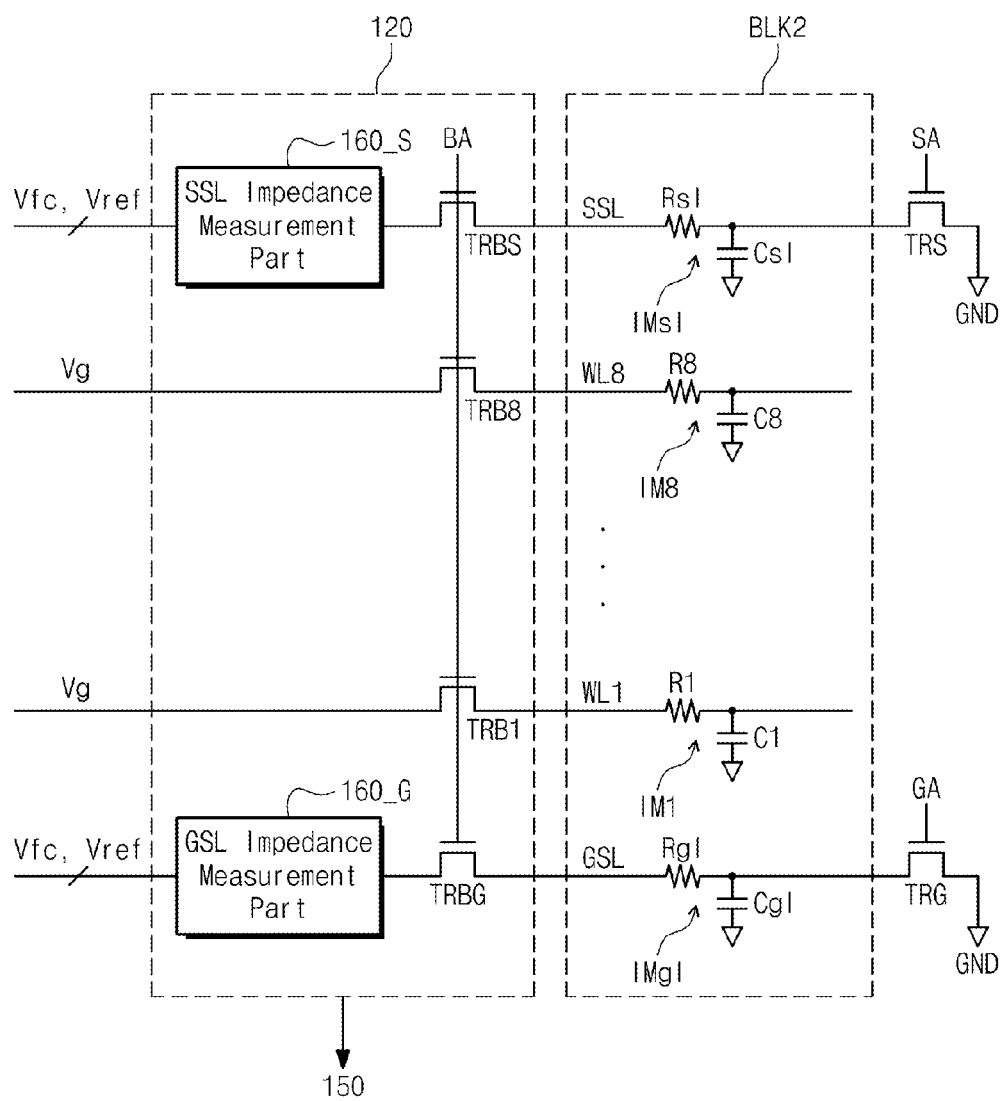
FIG. 14 is a diagram showing an address decoder and a normal block shown in FIG. 13, according to example embodiments of inventive concepts.

FIG. 14 is a diagram showing an address decoder and a normal block shown in FIG. 13, according to example embodiments of inventive concepts. FIG. 14 shows an equivalent circuit of word lines and ground and string selection lines of a normal block as seen from an address decoder 120.

Referring to FIG. 14, an address decoder 120 is connected to word lines WL1 through WL8, a string selection line SSL, and a ground selection line GSL. The address decoder 120 includes an SSL impedance measurement part 160_S and a GSL impedance measurement part 160_G. The address decoder 120 further includes block selection transistors TRB1 through TRB8, TRBS, and TRBG.

A normal block BLK2 contains a ground selection line GSL, a string selection line SSL, and word lines WL1 through WL8 disposed between the ground selection line GSL and the string selection line SSL. The ground selection line GSL has intrinsic impedance IMgl, the string selection line SSL intrinsic impedance IMsl, and word lines WL1 through WL8 intrinsic impedance IM1 through IM8.

The impedances IM1 through IM8 of the word lines WL1 through WL8 include (and/or consist of) corresponding word line resistors R1 through R8 and corresponding word line capacitors C1 through C8. The word line resistors R1 through R8 are resistors of the word lines WL1 through WL8, and the word line capacitors C1 through C8 are parasitic capacitors formed between the word lines WL1 through WL8 and neighboring lines.

The impedance IMgl of the ground selection line GSL includes (or consists of) a ground selection line resistor Rgl and a ground selection line capacitor Cgl. The ground selection line resistor Rgl is a resistor of the ground selection line GSL, and the ground selection line capacitor Cgl is a parasitic capacitor formed between the ground selection line GSL and neighboring lines.

The impedance IMsl of the string selection line SSL includes (or consists of) a string selection line resistor Rsl and a string selection line capacitor Csl. The string selection line resistor Rsl is a resistor of the string selection line SSL, and the string selection line capacitor Csl is a parasitic capacitor formed between the string selection line SSL and neighboring lines.

One end of the string selection line SSL is electrically connected to the SSL impedance measurement part 160_S through the block selection transistor TRBS, and the other end thereof receives a ground signal GND through a string selection transistor TRS. A string selection signal SA is applied to a gate terminal of the string selection transistor TRS. An input terminal of the string selection transistor TRS receives the ground signal GND, and an output terminal thereof is connected to the string selection line SSL.

If the string selection signal SA is applied to the string selection transistor TRS and the block selection signal BA is applied to the block selection transistor TRBS, the SSL impedance measurement part 160_S may receive a test voltage Vfc and a reference voltage Vref from a voltage generation circuit 130 (refer to FIG. 1) to measure impedance information of the string selection line SSL. The SSL impedance measurement part 160_S provides the measured impedance information of the string selection line SSL to control logic 150 (refer to FIG. 1).

One end of the ground selection line GSL is electrically connected to the GSL impedance measurement part 160_G through the block selection transistor TRBG, and the other end thereof receives a ground signal GND through a ground selection transistor TRG. A ground selection signal GA is applied to a gate terminal of the ground selection transistor TRG. An input terminal of the ground selection transistor TRG receives the ground signal GND, and an output terminal thereof is connected to the ground selection line GSL.

If the ground selection signal GA is applied to the ground selection transistor TRG and the block selection signal BA is applied to the block selection transistor TRBG, the GSL impedance measurement part 160_G may receive the test voltage Vfc and the reference voltage Vref from the voltage generation circuit 130 to measure impedance information of the ground selection line GSL. The GSL impedance measurement part 160_G provides the measured impedance information of the ground selection line GSL to the control logic 150.

The SSL impedance measurement part 160_S and the GSL impedance measurement part 160_G are configured substantially the same as that of FIG. 9, and a description thereof is thus omitted.

According to example embodiments of inventive concepts, the SSL impedance measurement part 160_S and the GSL impedance measurement part 160_G measure impedance values of the string selection line SSL and the ground selection line GSL of a normal block BLK2. The impedance information of the string selection line SSL and the impedance information of the ground selection line GSL may be impedance information of word lines WL1 through WL8.

The impedances IM1 through IM8 of the word lines WL1 through WL8 may sequentially vary between the string selection line SSL and the ground selection line GSL due to pillar and word line cut shapes. The control logic 150 differently applies impedances of the word lines WL1 through WL8, based on an impedance difference between the string selection line SSL and the ground selection line GSL.

The control logic 150 uses impedance information word lines measured by means of the normal block BLK2 as impedance information of word lines of remaining normal blocks. However, example embodiments of inventive concepts are not limited thereto. For example, the control logic 150 may measure impedance information of word lines of each of normal blocks BLK1 through BLKz (refer to FIG. 13). The control logic 150 adjusts an offset voltage level and an offset time, based on word line impedances.

Although FIG. 14 illustrates an example with one string selection line SSL, eight word lines WL1 to WL8, and one ground selection line GSL, example embodiments are not limited thereto. The number of string selection lines, word lines, and ground selection lines in the normal block BLK2 may be adjusted. Also, the address decoder 120 may have a different number of string selection line impedance measurement parts 160_S, ground selection line impedance measurement parts 160_G, block selection transistors TRB1 through TRB8, TRBS, and TRBG in order to correspond to the structure of the normal block BLK2.

Figure 15:
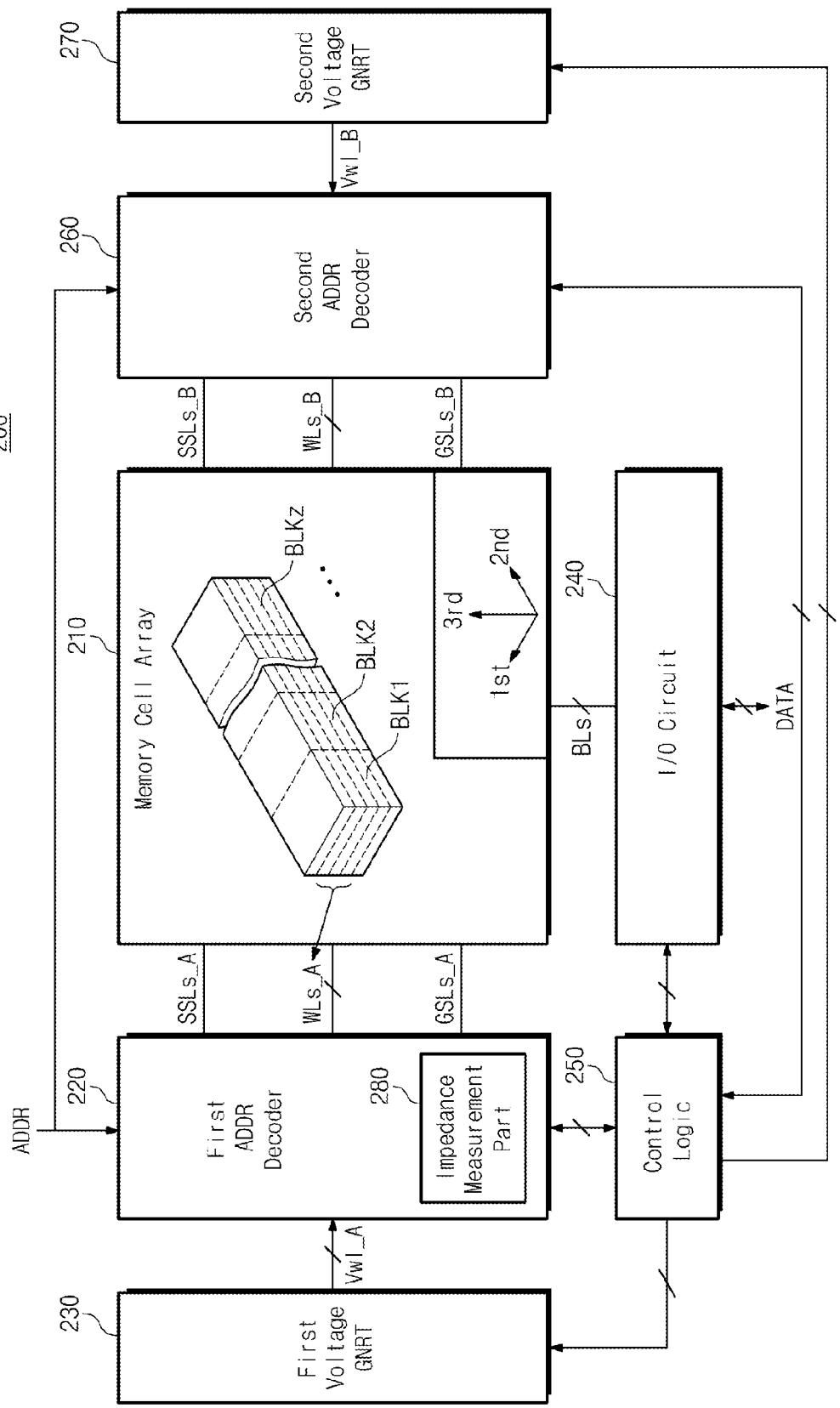
FIG. 15 is a diagram showing a nonvolatile memory device according to example embodiments of inventive concepts.

FIG. 15 is a diagram showing a nonvolatile memory device according to example embodiments of inventive concepts. Referring to FIG. 15, a nonvolatile memory device 200 contains a memory cell array 210, a first address decoder 220, a second address decoder 260, a first voltage generation circuit 230, a second voltage generation circuit 270, an input/output circuit 240, and control logic 250.

A difference between nonvolatile memory devices shown in FIGS. 1 and 15 will be mainly described, and the remaining complies with a description associated with FIG. 1.

The memory cell array 210 contains a plurality of memory blocks BLK1 through BLKz (z being an integer of 2 or more). Each of the memory blocks BLK1 through BLKz is connected to the first address decoder 220 through word lines WLs_A, at least one string selection line SSLs_A, and at least one ground selection line GSLs_A. Each of the memory blocks BLK1 through BLKz is connected to the second address decoder 260 through word lines WLs_B, at least one string selection line SSLs_B, and at least one ground selection line GSLs_B. Each of the memory blocks BLK1 through BLKz is connected to the input/output circuit 240. In example embodiments, the word lines may be formed to have a shape where plates are stacked.

Word lines connected to the first address decoder 220 are different from those of the second address decoder 260. A string selection line connected to the first address decoder 220 is different from that of the second address decoder 260.

The first address decoder 220 and the second address decoder 260 may select one of the memory blocks BLK1 through BLKz in response to an address.

At least one of the first address decoder 220 and the second address decoder 260 may include an impedance measurement part 280. Below, an example is described whether the first address decoder 220 includes the impedance measurement part 280. However, example embodiments of inventive concepts are not limited thereto. For example, the impedance measurement part 280 may be included in the second address decoder 260 or in both the first address decoder 220 and the second address decoder 260.

The impedance measurement part 280 measures impedance information of each word line of a selected memory block BLKi. The first address decoder 220 provides the control logic 250 with the measured impedance information.

Each of the first and second voltage generation circuits 230 and 270 generates operating voltages including the following: a program voltage, a pass voltage, a read voltage, a read pass voltage, a verification voltage, an erase operation, a common source line voltage, and a well voltage. The first and second voltage generation circuits 230 and 270 also generate word line voltages Vwl_A and Vwl_B used for a program/read/erase operation, respectively. Herein, each of the word line voltages Vwl_A and Vwl_B contains a variable offset pulse for shortening a word line setup time. In example embodiments, a voltage level of the variable offset voltage (or, pulse) may be higher or lower than a normal voltage level (hereinafter, referred to as target level) of each of the word line voltages Vwl_A and Vwl_B needed to drive word lines.

The first and second voltage generation circuits 230 and 270 selectively generate the word line voltages Vwl_A and Vwl_B each having an offset voltage depending on a control of the control logic 250. That is, the first and second voltage generation circuits 230 and 270 may generate the word line voltages Vwl_A and Vwl_B each including the offset voltage or not including the offset voltage.

The first voltage generation circuit 230 applies the word line voltage Vwl_A to the word lines WLs_A, and the second voltage generation circuit 270 applies the word line voltage Vwl_B to the word lines WLs_B.

Moreover, each of the first and second voltage generation circuits 230 and 270 changes a level and a generation time of the offset voltage in response to a control of the control logic 150.

A detailed description about the input/output circuit 240 is omitted and complies with a description associated with an input/output circuit 140 shown in FIG. 1.

The control logic 250 controls an overall operation of the nonvolatile memory device 200 including a program operation, a read operation, an erase operation, and so on. The control logic 250 operates in response to control signals or commands from an external device. The control logic 250 controls the first and second address decoders 220 and 260, the first and second voltage generation circuits 230 and 270, and the input/output circuit 240 at program, erase, and read operations.

Specifically, the nonvolatile memory device 200 according to example embodiments of inventive concepts calculates impedance values of word lines of each memory block BLKi depending on impedance information of a selected memory block and controls the first and second voltage generation circuits 230 and 270 such that adjusted are an offset voltage level and an offset time depending on the calculated impedance values of the word lines.

Figure 16:
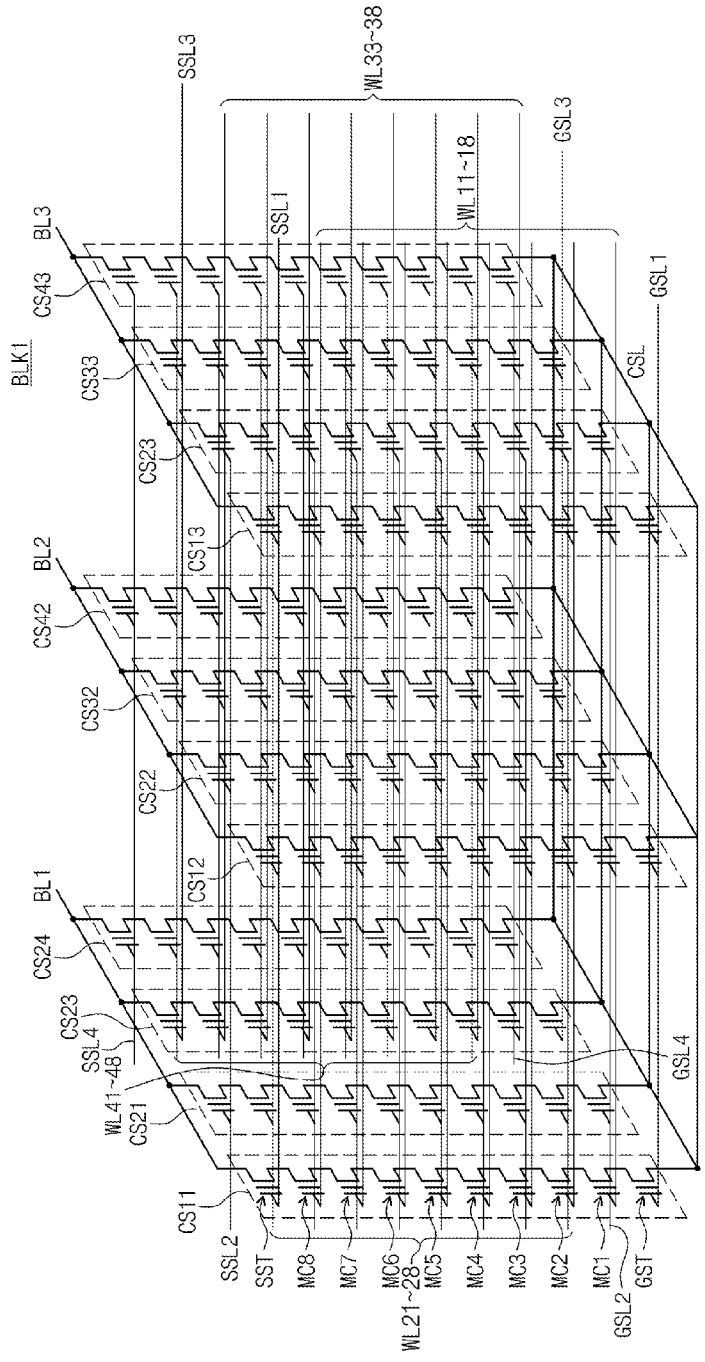
FIG. 16 is an equivalent circuit diagram of a memory block shown in FIG. 15.

FIG. 16 is an equivalent circuit diagram of a memory block BLK1 shown in FIG. 15. Referring to FIG. 16, cell strings CS11 through CS43 are connected between bit lines BL1 through BL3 and a common source line CSL. Each cell string (e.g., CS11) includes a string selection transistor SST, a plurality of memory cells MC1 through MC8, and a ground selection transistor GST. In FIG. 16, an example is shown where a string includes eight memory cells. However, example embodiments of inventive concepts are not limited thereto.

Word lines WL11 through WL48 are connected to a first address decoder 220 and a second address decoder 260 alternatively and one by one when seen from a third direction (a direction perpendicular to a substrate). In FIG. 16, an example is shown where the word lines WL11 through WL48 are connected to the first address decoder 220 and the second address decoder 260 alternatively and one by one when seen from the third direction.

The word lines WL11 through WL48 include (and/or consist of) first row word lines WL11 through WL18, second row word lines WL21 through WL28, third row word lines WL31 through WL38, and fourth row word lines WL41 through WL48.

The first row word lines WL11 through WL18 and the third row word lines WL31 through WL38 are connected to the second address decoder 260, and the second row word lines WL21 through WL28 and fourth row word lines WL41 through WL48 are connected to the first address decoder 220.

String selection lines SSL1 through SSL4 are connected to the first address decoder 220 and the second address decoder 260 alternately and one by one when seen from the third direction. In example embodiments, the first and third string selection lines SSL1 and SSL3 are connected to the second address decoder 260, and the second and fourth string selection lines SSL2 and SSL4 are connected to the first address decoder 220.

Ground selection lines GSL1 through GSL4 are connected to the first address decoder 220 and the second address decoder 260 alternately and one by one when seen from the third direction. In example embodiments, the first and third ground selection lines GSL1 and GSL3 are connected to the second address decoder 260, and the second and fourth ground selection lines GSL2 and GSL4 are connected to the first address decoder 220. However, example embodiments of inventive concepts are not limited thereto. In example embodiments, the first through fourth ground selection lines GSL1 through GSL4 are connected to either the first address decoder 220 or the second address decoder 260.

Figure 17:
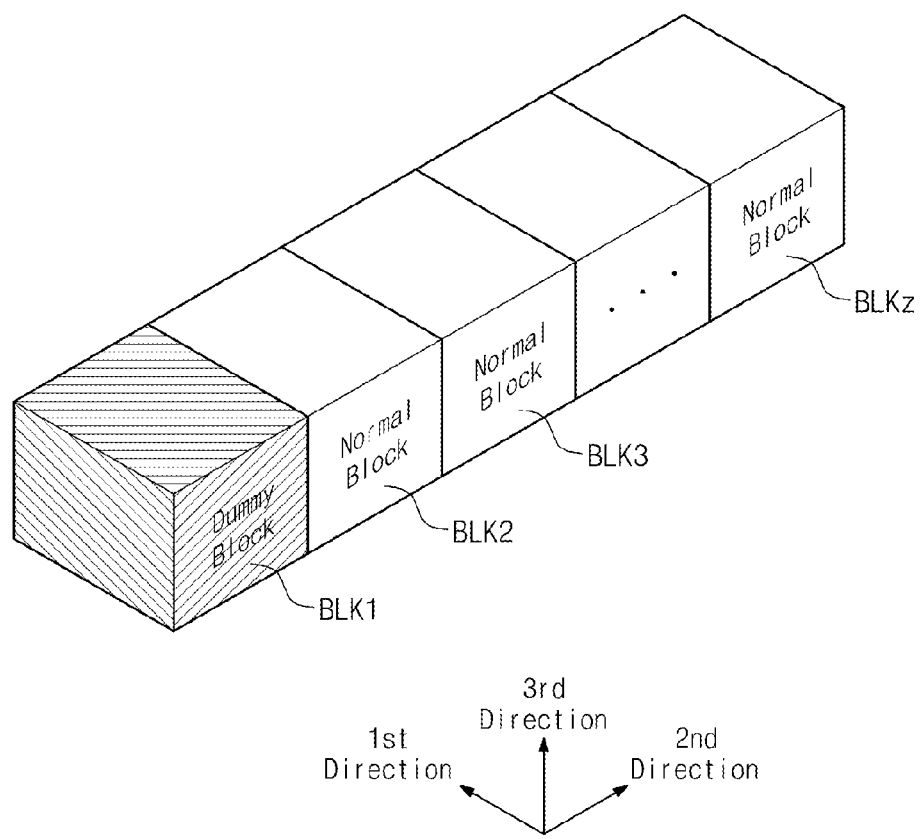
FIG. 17 is a diagram showing a plurality of memory blocks shown in FIG. 15, according to example embodiments of inventive concepts.

FIG. 17 is a diagram showing a plurality of memory blocks shown in FIG. 15, according to example embodiments of inventive concepts.

Referring to FIG. 17, at least one of memory blocks BLK1 through BLKz may be a dummy block. The memory blocks BLK1 through BLKz according to example embodiments of inventive concepts may include one dummy block BLK1.

The dummy block BLK1 is a memory block for measuring impedance values of word lines; on the other hand, it is not used to store data.

Impedance information of the word lines measured by means of the dummy block BLK1 may be used as word line impedance information of the normal memory blocks BLK2 through BLKz. The dummy block BLK1 has a structure that is different from the normal memory blocks BLK2 through BLKz to measure impedance information of word lines.

Figure 18:
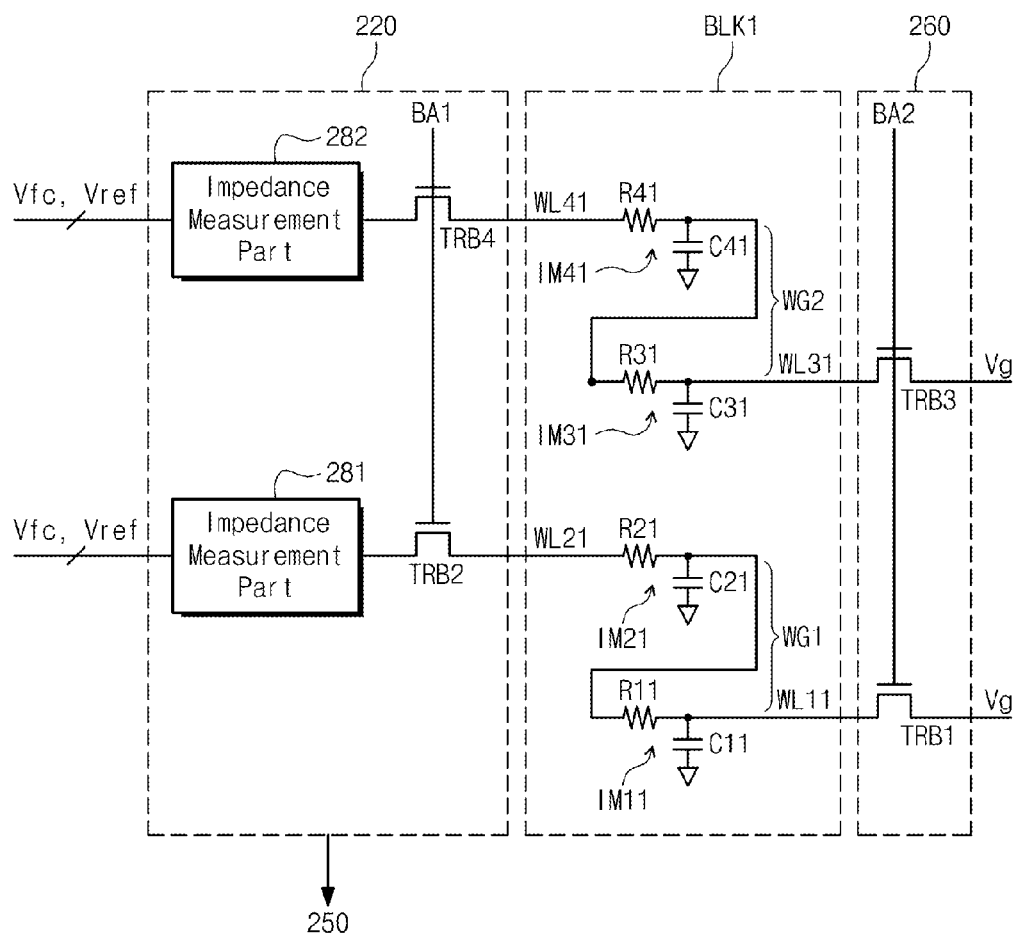
FIG. 18 is a diagram showing a dummy block and first and second address decoders shown in FIG. 17, according to example embodiments of inventive concepts.

FIG. 18 is a diagram showing a dummy block and first and second address decoders shown in FIG. 17, according to example embodiments of inventive concepts. In FIG. 18, four word lines, having the same height, from among first row through fourth row word lines are denoted by an equivalent circuit seen from first and second decoders.

Referring to FIG. 18, a first address decoder 220 is connected to a second row word line WL21 and a fourth row word line WL41 and contains impedance measurement parts 281 and 282 and block selection transistors TRB2 and TRB4.

A second address decoder 260 is connected to a first row word line WL11 and a third row word line WL31 and contains block selection transistors TRB1 and TRB3.

The first row through fourth row word lines WL11 through WL41 may have intrinsic impedances IM1 through IM8, which include (and/or consist of) word line resistors R11 through R41 and word line capacitors C11 through C41.

The word line resistors R11 through R41 are resistors of the first row through fourth row word lines WL11 through WL41, and the word line capacitors C11 through C41 are parasitic capacitors formed between the first row through fourth row word lines WL11 through WL41 and neighboring lines.

The first row through fourth row word lines WL11 through WL41 may be divided into word line groups WG1 and WG2 each having two word lines that have the same height, are adjacent to each other, and are connected to different address decoders. For example, the word line group WG1 includes two word lines WL11 and WL21. The word line group WG1, the impedance measurement part 281, and the block selection transistors TRB1 and TRB2 constitute a current path.

Below, one word line group WG1 and block selection transistors TRB1 and TRB2 and an impedance measurement part 281 connected to the word line group WG1 will be described.

The impedance measurement part 281 is connected to one WL21 of the word lines WL11 and WL21 of the word line group WG1. This means that the number of impedance measurement parts 281 through 282 is half the number of word lines WL11 through WL41.

The impedance measurement part 281 receives a test voltage Vfc and a reference voltage Vref from a first voltage generation circuit 230 (refer to FIG. 15) to measure impedance information of the word lines WL11 and WL12 of the word line group WG1. The impedance measurement part 281 provides the measured impedance information to control logic 250 (refer to FIG. 15).

The block selection transistors TRB1 through TRB4 are turned on or off by block selection signals BA1 and BA2.

Selected is a dummy block BLK1 when the block selection transistors TRB1 through TRB4 are turned on.

One TRB2 of the block selection transistors TRB1 and TRB2 connected to the word lines WL11 and WL21 of the word line group WG1 is connected to the impedance measurement part 281; however, the other TRB1 is not connected to the impedance measurement part 281. The block selection transistor TRB1 not connected to the impedance measurement part 281 receives a ground voltage Vg from a second voltage generation circuit 270 (refer to FIG. 15).

The word lines WL11 and WL21 of the word line group WG1 are interconnected. One end of the first row word line WL11 is receives the ground voltage Vg through the block selection transistor TRB1, and one end of the second word line WL21 is electrically connected to the impedance measurement part 281 through the block selection transistor TRB2. The other ends of the word lines WL11 and WL21 are connected to each other.

The impedance measurement part 281 is configured substantially the same as that of FIG. 9, and a description thereof is thus omitted.

The impedance measurement part 281 measures impedance values of the word lines WL11 and WL21 of the word line group WG1. The control logic 250 uses an average of the measured impedance values of the word lines WL11 and WL21 as an impedance value of each of the first and second row word lines WL11 and WL21. Impedance values of all word lines of the dummy block BLK1 may be measured by measuring word line impedances every row and every height by means of the above-described way.

The control logic 250 uses impedance information of word lines measured by means of the dummy block BLK1 as impedance information of word lines of normal memory blocks BLK2 through BLKz (refer to FIG. 17). The control logic 250 adjusts an offset voltage level and an offset time, depending on word line impedances.

Figure 19:
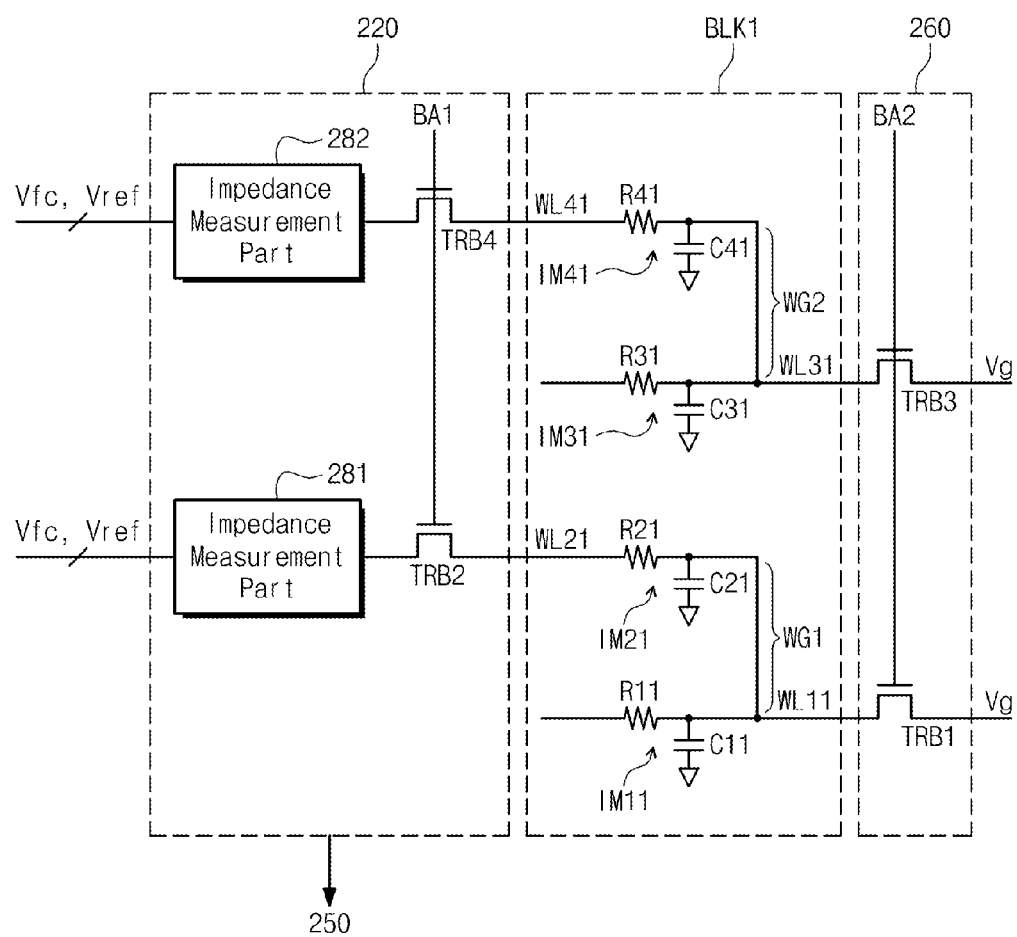
FIG. 19 is a diagram showing an address decoder and a dummy block shown in FIG. 17, according to example embodiments of inventive concepts.

FIG. 19 is a diagram showing an address decoder and a dummy block shown in FIG. 17, according to example embodiments of inventive concepts. FIG. 19 shows an equivalent circuit of four word lines, having the same height, from among first through fourth row word lines as seen from an address decoder. A difference between FIGS. 18 and 19 will be mainly described.

Below, a word line group WG1 and block selection transistors TRB1 and TRB2 and an impedance measurement part 281 connected to the word line group WG1 will be described with reference to FIG. 19.

Two word lines WL11 and WL21 of the word line group WG1 are interconnected. One end of the first row word line WL11 is electrically connected to receive the ground voltage Vg through the block selection transistor TRB1, and one end of the word line WL21 is electrically connected to the impedance measurement part 181 through the block selection transistor TRB2. The other ends of the word lines WL11 and WL21 are connected to each other.

The impedance measurement part 281 receives a test voltage Vfc and a reference voltage Vref from a voltage generation circuit 230 (refer to FIG. 15) to measure an impedance value of one word line WL21 of the word line group WG1. The impedance measurement part 281 provides the measured impedance information to control logic 250 (refer to FIG. 15).

According to example embodiments of inventive concepts, the impedance measurement part 281 measures an impedance value of one WL21 of the word lines WL11 and WL21 of the word line group WG1. The control logic 250 uses the measured impedance value of the word line WL21 as an impedance value of the other word line WL11. The control logic 250 uses impedance information of word lines measured by means of a dummy block BLK1 as impedance information of word lines of normal memory blocks BLK2 through BLKz (refer to FIG. 17). The control logic 250 adjusts an offset voltage level and an offset time, depending on word line impedances.

Figure 20:
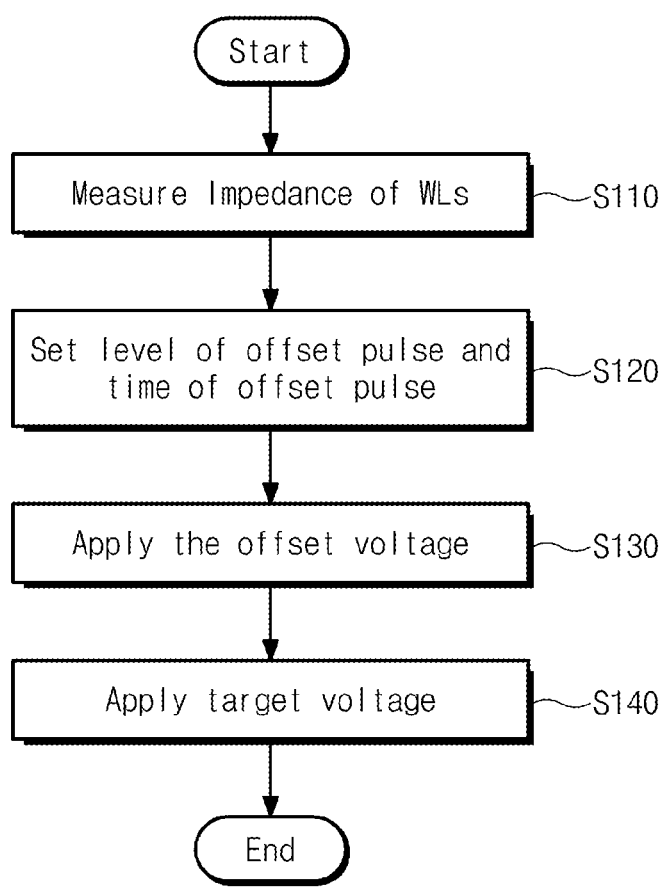
FIG. 20 is a flow chart showing a word line driving method of a nonvolatile memory device according to example embodiments of inventive concepts.

FIG. 20 is a flow chart showing a word line driving method of a nonvolatile memory device according to example embodiments of inventive concepts.

First, in step S110, the control logic calculates word line impedances. A method for calculating word line impedances is described with reference to FIGS. 1 through 19.

In step S120, the control logic sets an offset voltage level and an offset applying time, based on the calculated word line impedances.

In step S130, an offset voltage having the offset voltage level thus set is applied to a word line during the offset applying time thus set. In step S140, a target voltage needed to drive the word line is applied to the word line. The target voltage may be any one of a program voltage Vpgm, a pass voltage Vpass, a read pass voltage Vread, a read voltage Vr, and a verification voltage VF.

Figure 21:
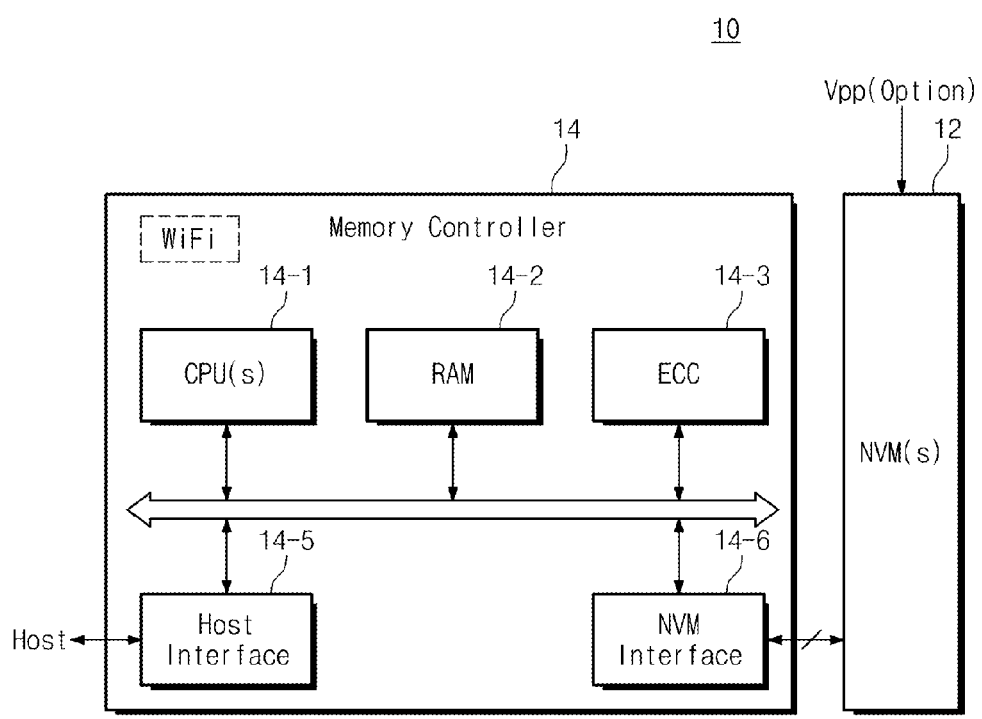
FIG. 21 is a block diagram schematically illustrating a storage device according to example embodiments of inventive concepts.

FIG. 21 is a block diagram schematically illustrating a storage device 10 according to example embodiments of inventive concepts. Referring to FIG. 21, a storage device 10 contains at least one nonvolatile memory device 12 and a memory controller 14 to control the nonvolatile memory device 12. The storage device 10 shown in FIG. 21 may be used as, but not limited to, a storage medium of a memory card (e.g., CF, SD, micro SD, and so on) or an USB storage device.

The nonvolatile memory device 12 may be implemented with a nonvolatile memory device 100 described with reference to FIGS. 1 through 21 and may operate based on a word line voltage applying method thereof.

The memory controller 14 controls read, write, and erase operations of the nonvolatile memory device 12 in response to a host request. The memory controller 14 contains at least one central processing unit 14-1, a RAM 14-2, an ECC block 14-3, a host interface 14-5, and an NVM interface 14-6.

The central processing unit 14-1 controls the following of the nonvolatile memory device 12: writing, reading, management of a file system, management of bad pages, and so on. The RAM 14-2 operates in response to a control of the central processing unit 14-1 and is used as a working memory, a buffer memory, and a cache memory. If the RAM 14-2 is used as a working memory, data processed by the central processing unit 14-1 may be temporarily stored therein. Used as a buffer memory, the RAM 14-2 is used to buffer data that is transferred from a host to the nonvolatile memory device 12 or from the nonvolatile memory device 12 to the host. As a cache memory, the RAM 14-2 may enable a low-speed nonvolatile memory device 12 to operate at high speed.

The ECC block 14-3 generates an error correction code ECC for correcting a fail bit or an error bit of data received from the nonvolatile memory device 12. The ECC block 14-3 performs error correction encoding on data to be provided to the nonvolatile memory device 12, so parity information is added thereto. The parity information may be stored in the nonvolatile memory device 12. The ECC block 14-3 performs error correction decoding on data output from the nonvolatile memory device 12. The ECC block 14-3 corrects an error using the parity. The ECC block 14-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 14 exchanges data with the host through the host interface 14-5 and with the nonvolatile memory device 12 through the NVM interface 14-6. The host interface 14-5 may be connected with a host via PATA (Parallel AT Attachment bus), SATA (Serial AT attachment bus), SCSI, USB, PCIe, NAND interface, and so on.

In example embodiments, the memory controller 14 may be equipped with a wireless communication function (e.g., Wi-Fi).

In the VNAND structure, generally, word line loading is relatively greater than that of a planar or NAND flash memory and loading of word lines varies with impedance differences among word lines. In this regard, a word line setup time becomes a performance factor. For this reason, a VNAND according to example embodiments of inventive concepts may reduce a setup time difference between near and far word lines at a read/verification operation by applying a voltage higher or lower than a target level of a word line during a desired (and/or alternatively predetermined) time and then applying the target level to the word line. As a difference between setup times is reduced, the whole word line setup time may decrease. This is named a word line offset applying technique. The word line offset applying technique may be selectively applied to a VNAND according to example embodiments of inventive concepts.

In example embodiments of inventive concepts, the storage device 10 calculates impedance values of word lines and adjusts an offset voltage level and an offset time depending on the calculated impedance values of the word lines. Moreover, the storage device 10 according to example embodiments of inventive concepts constantly maintains a setup time of a word line voltage regardless of an impedance difference between word lines and sets an overshoot of the word line voltage to an optimal condition, thereby improving performance of the storage device 10 overall.

Example embodiments of inventive concepts may be embodied as a solid state drive (SSD).

Figure 22:
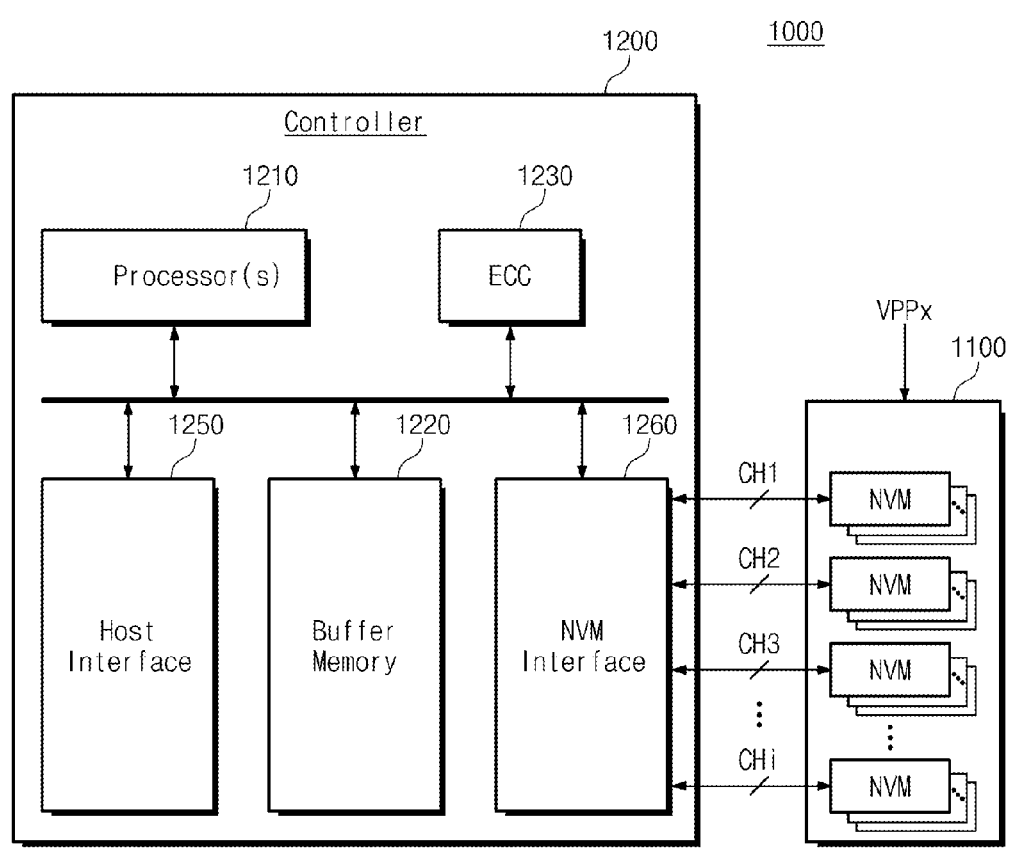
FIG. 22 is a block diagram schematically illustrating a solid state drive according to example embodiments of inventive concepts.

FIG. 22 is a block diagram schematically illustrating a solid state drive according to example embodiments of inventive concepts. Referring to FIG. 22, a solid state drive (hereinafter, referred to as SSD) 1000 includes a plurality of nonvolatile memory devices 1100 and an SSD controller 1200.

The nonvolatile memory devices 1100 are implemented to be provided with an external high voltage VPPx optionally. Each of the nonvolatile memory devices 1100 may be implemented to generate a word line voltage Vwl having a variable offset voltage (or, pulse) as described with reference to FIGS. 1 and 20. The SSD controller 1200 is connected to the nonvolatile memory devices 1100 through a plurality of channels CH1 through CHi (i being an integer of 2 or more). The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In example embodiments, the buffer memory 1220 may include a plurality of memory lines each of which stores data or a command. The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 22, a code memory may be further included to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100.

The SSD 1000 according to example embodiments of inventive concepts adjusts an offset voltage level and an offset time by means of word line impedances, thereby improving performance overall.

Example embodiments of inventive concepts may be embodied as an eMMC (e.g., an embedded multimedia card, moviNAND, iNAND, etc.).

Figure 23:
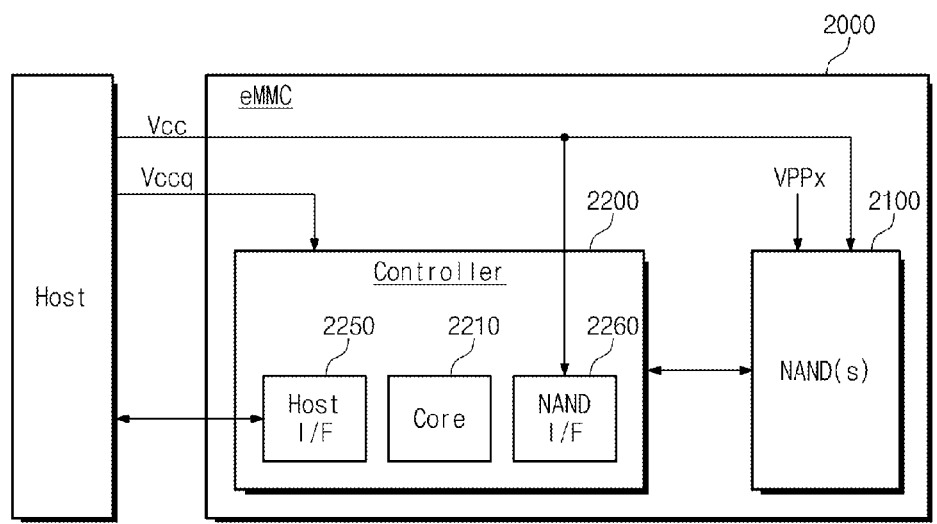
FIG. 23 is a block diagram schematically illustrating an eMMC according to example embodiments of inventive concepts.

FIG. 23 is a block diagram schematically illustrating an eMMC according to example embodiments of inventive concepts. Referring to FIG. 23, an eMMC 2000 includes one or more NAND flash memory devices 2100 and a controller 2200.

Each of the NAND flash memory device 2100 may be implemented such that a word line voltage Vwl includes an offset voltage (or, pulse) as described with reference to FIGS. 1 through 20. The controller 2200 is connected to the NAND flash memory devices 2100 through a plurality of channels. The controller 2200 includes one or more controller cores 2210, a host interface 2250, and a NAND interface 2260. The controller core 2210 may control an overall operation of the eMMC 2000. The host interface 2250 is configured to perform an interface between the controller 2200 and a host. The NAND interface 2260 is configured to provide an interface between the NAND flash memory device 2100 and the controller 2200. In example embodiments, the host interface 2250 may be a parallel interface (e.g., MMC interface). In example embodiments, the host interface 2250 of the eMMC 2000 may be a serial interface (e.g., UHS-II, UFS interface, etc.). As another example, the host interface 2250 may be a NAND interface.

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In example embodiments, the eMMC 2000 may be optionally supplied with an external high voltage.

The eMMC 2000 according to example embodiments of inventive concepts adjusts an offset voltage level and an offset time by means of word line impedances, thereby improving performance overall.

Example embodiments of inventive concepts may be embodied as Universal Flash Storage UFS.

Figure 24:
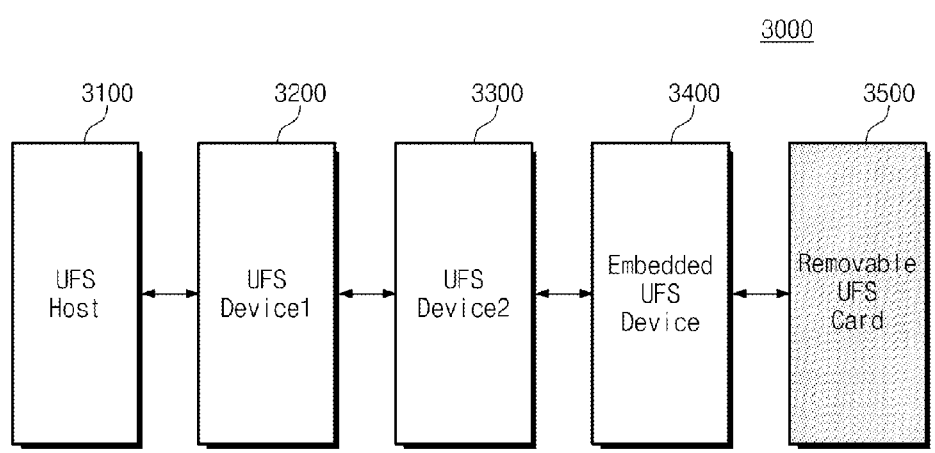
FIG. 24 is a block diagram schematically illustrating a UFS system according to example embodiments of inventive concepts.

FIG. 24 is a block diagram schematically illustrating a UFS system according to example embodiments of inventive concepts. Referring to FIG. 24, a UFS system 3000 includes a UFS host 3100, an embedded UFS device 3200, and a removable UFS card 3300. Communication between the UFS host 3100 and the embedded UFS device 3200 and communication between the UFS host 3100 and the removable UFS card 3300 may be performed through M-PHY layers. At least one of the embedded UFS device 3200 and the removable UFS card 3300 may be implemented with a storage device 10 described with reference to FIG. 21.

Meanwhile, the host 3100 includes a bridge that enables the removable UFS card 3300 to communicate using the protocol different from the UFS protocol. The UFS host 3100 and the removable UFS card 3300 may communicate through various card protocols (e.g., UFDs, MMC, SD (secure digital), mini SD, Micro SD, etc.).

Example embodiments of inventive concepts may be embodied as a mobile device.

Figure 25:
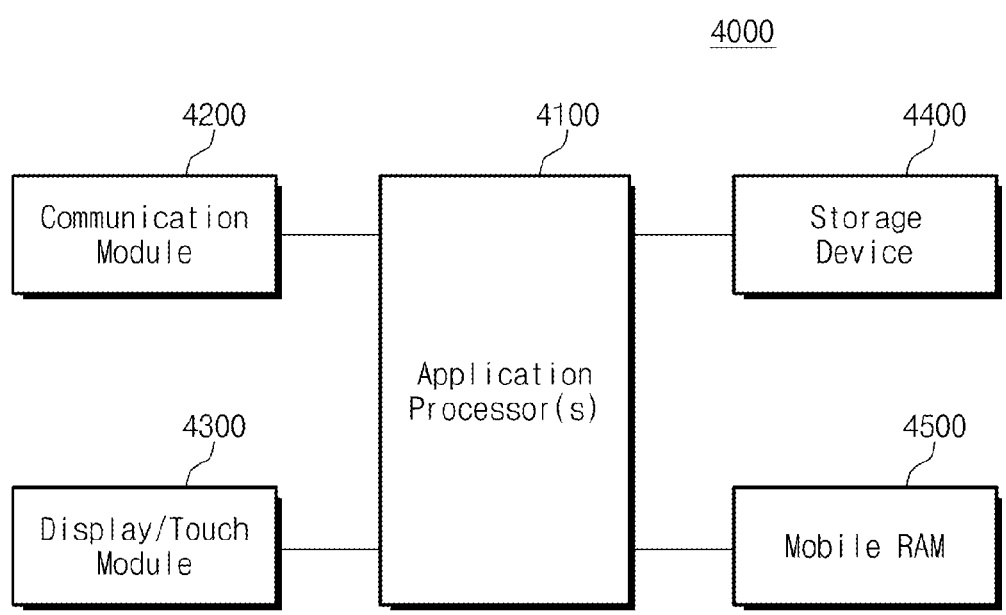
FIG. 25 is a block diagram schematically illustrating a mobile device according to example embodiments of inventive concepts.

FIG. 25 is a block diagram schematically illustrating a mobile device 4000 according to example embodiments of inventive concepts. Referring to FIG. 25, a mobile device 4000 includes an application processor 4100, a communication module 4200, a display/touch module 4300, a storage device 4400, and a mobile RAM 4500.

The application processor 4100 controls an overall operation of the mobile device 4000, and the communication module 4200 conducts wireless/wire communications with an external device. The display/touch module 4300 is implemented to display data processed by the application processor 4100 or to receive data through a touch panel. The storage device 4400 is implemented to store user data. The storage device 4400 may be, but not limited to, a memory card, an eMMC, an SSD, or an UFS device. The storage device 4400 may be implemented to control an offset voltage level, an offset time, and whether to apply an offset voltage as described with reference to FIGS. 1 through 21. The mobile RAM 4500 is implemented to store data used for processing of the mobile device 4000 temporarily.

The mobile device 4000 according to example embodiments of inventive concepts includes the storage device that is configured to adjust an offset voltage level and an offset time by means of word line impedances, thereby improving performance overall.

A memory system or a storage device according to example embodiments of inventive concepts may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While some example embodiments have been particularly shown and described, it will be understood by one of ordinary skill in the art that variations in form and detail may be made therein without departing from the spirit and scope of the claims.

What is claimed is:

1. A nonvolatile memory device comprising:
a memory cell array including a plurality of memory blocks on a substrate, each of the memory blocks including a plurality of strings arranged in a direction perpendicular to the substrate and connected between bit lines and a common source line;
an address decoder configured to select one of the memory blocks in response to an address, the address decoder being configured to measure impedance information of word lines of the selected memory block;
an input/output circuit configured to at least one of,
store data to be programmed at memory cells connected to a selected word line during a program operation, and
to store data read from memory cells connected to the selected word line during a read or verification operation;
a voltage generation circuit configured to generate word line voltages to be applied to the selected word line and unselected word lines, at least one of the word line voltages including an offset voltage and a target voltage, the offset voltage being different than the target voltage during an offset time; and a control logic configured to adjust a level of the offset voltage or the offset time depending on the measured impedance information of the word lines.

2. The nonvolatile memory device of claim 1, wherein the control logic is configured to calculate impedance values of word lines of each memory block depending on the measured impedance information of the word lines, and the control logic is configured to control the voltage generation circuit to adjust the level of the offset voltage and the offset time depending on the calculated impedance values of the word lines.

3. The nonvolatile memory device of claim 1, wherein the address decoder includes:

an impedance measurement part configured to measure impedance information of the word lines based on a test voltage and a reference voltage from the voltage generation circuit.

4. The nonvolatile memory device of claim 3, wherein the impedance measurement part includes:

a first input terminal configured to receive the test voltage;

a second input terminal configured to receive the reference voltage;

an ammeter configured to measure a current flowing through the first input terminal;

a comparator configured to output a comparison result based on the reference voltage and a voltage of a node between at least one of the word lines and the first input terminal.

5. The nonvolatile memory device of claim 1, wherein the selected memory block is a dummy block that is not configured to store data.

6. The nonvolatile memory device of claim 5, wherein one end of at least one of the word lines is electrically connected to an impedance measurement part, and the other end of the at least one word line is connected to the common source line.

7. The nonvolatile memory device of claim 5, wherein the word lines include a first word line and a second word line that are adjacent to each other in the direction perpendicular to the substrate, and the first and second word lines are interconnected.

8. The nonvolatile memory device of claim 7, wherein one end of the first word line is electrically connected to an impedance measurement part, one end of the second word line is configured to receive a ground voltage from the voltage generation circuit, and the other ends of the first and second word lines are interconnected.

9. The nonvolatile memory device of claim 7, wherein one end of the first word line is electrically connected to an impedance measurement part, one end of the second word line is configured to receive a ground voltage from the voltage generation circuit, and the other end of the first word line is connected with the one end of the second word line.

10. The nonvolatile memory device of claim 5, wherein the address decoder includes a first address decoder and a second address decoder, word lines connected to the first address decoder are different from word lines connected to the second address decoder, the word lines include a first word line connected to the first address decoder and a second word line connected to the second address decoder, a height of the second word line is the same as a height of the first word line, and the first and second word lines are interconnected.

11. The nonvolatile memory device of claim 10, wherein one end of the first word line is electrically connected to the impedance measurement part, one end of the second word line is configured to receive a ground voltage from the voltage generation circuit, and the other ends of the first and second word lines are interconnected.

12. The nonvolatile memory device of claim 10, wherein one end of the first word line is electrically connected to an impedance measurement part, one end of the second word line is configured to receive a ground voltage from the voltage generation circuit, and the other end of the first word line is connected with the one end of the second word line.

13. The nonvolatile memory device of claim 3, wherein the selected memory block is a normal block configured to store data, the normal block includes a string selection line and a ground selection line with the word lines interposed therebetween, the address decoder includes an SSL impedance measurement part and a GSL impedance measurement part, the SSL impedance measurement part is configured to receive a test voltage and a reference voltage from the voltage generation circuit, the SSL impedance measurement part is configured to measure impedance information of the string selection line, and the GSL impedance measurement part is configured to receive the test voltage and the reference voltage from the voltage generation circuit, the GSL impedance measurement part is configured measure impedance information of the ground selection line, one end of the string selection line is electrically connected to the SSL impedance measurement part and the other end of the string selection line is configured to receive a ground signal, and one end of the ground selection line is electrically connected to the GSL impedance measurement part and the other end of the ground selection line is configured to receive the ground signal.

14. A word line driving method of a nonvolatile memory device that includes a plurality of memory blocks on a substrate, each of the memory blocks includes a plurality of strings arranged in a direction perpendicular to the substrate and connected between bit lines and a common source line, the word line driving method comprising:

calculating impedance values of word lines;

setting a level of an offset voltage or an offset time based on the calculated impedance values of the word lines;

applying the offset voltage, having the set level, to the word lines during the set offset time; and applying a target voltage to the word lines after the offset time, the target voltage being different than the offset voltage.

15. A nonvolatile memory device comprising:

a memory cell array including a plurality of word lines connected to a plurality of memory blocks on a substrate, each of the memory blocks including a plurality of strings on the substrate and connected between bit lines and a common source line;

an impedance measurement part connected to the plurality of memory blocks through the plurality of word lines, the impedance measurement part being configured to measure impedance information of the plurality of word lines;

an input/output circuit connected to the plurality of memory blocks through the bit lines;

a voltage generation circuit connected to the impedance measurement part, the voltage generation circuit being configured to generate voltages for applying to the plurality of word lines; and a control logic configured to adjust a level and an application time of one of the voltages applied to at least one of the word lines connected to a selected one of the plurality of memory blocks based on the measured impedance information of the at least one of the word lines.

16. The nonvolatile memory device of claim 15, wherein the control logic is configured to adjust a level of an offset voltage and a duration of an offset time that the offset voltage is applied to the at least one of the word lines based on the measured impedance information of the at least one of the word lines, the control logic is configured to apply the offset voltage to the at least one of the word lines before applying a target voltage to the at least one of the word lines, and the level of the offset voltage is different than a level of the target voltage.

17. The nonvolatile memory device of claim 15, wherein the selected one of the plurality of memory blocks is a normal block configured to store data.

18. The nonvolatile memory device of claim 15, wherein the selected one of the plurality of memory blocks is a dummy block that is not configured to store data.

19. The nonvolatile memory device of claim 15, wherein the impedance measurement part includes:

a first input terminal configured to receive a test voltage;

a second input terminal configured to measure a current flowing through the first input terminal; and a comparator configured to output a comparison result based on the reference voltage and a voltage of a node between the first input terminal and the at least one of the word lines connected to the selected one of the plurality of memory blocks.

20. The nonvolatile memory device of claim 15, wherein the plurality of strings are arranged in a direction perpendicular to the substrate, and each of the plurality of strings includes a ground selection transistor, a plurality of memory cells stacked on top of each other on the ground selection transistor, and a string selection transistor on the plurality of memory cells.

* * * * *